United States Patent [19]

Mallory et al.

[11] Patent Number: 4,755,746
[45] Date of Patent: Jul. 5, 1988

[54] APPARATUS AND METHODS FOR SEMICONDUCTOR WAFER TESTING

[75] Inventors: Chester Mallory, Campbell; David S. Perloff, Sunnyvale; Hung V. Pham, San Jose; Sandor Droblisch, Monte Sereno, all of Calif.

[73] Assignee: Prometrix Corporation, Santa Clara, Calif.

[21] Appl. No.: 726,498

[22] Filed: Apr. 24, 1985

[51] Int. Cl.$^4$ .................. G01R 31/02; G01R 31/28
[52] U.S. Cl. .................. 324/158 F; 324/64; 324/73 AT; 324/73 R
[58] Field of Search .......... 324/158 F, 158 P, 73 R, 324/73 PC, 73 AT, 64

[56] References Cited

U.S. PATENT DOCUMENTS

| | | | |
|---|---|---|---|
| 3,996,517 | 12/1976 | Fergason et al. | 324/158 F |
| 4,328,553 | 5/1982 | Fredriksen et al. | 364/559 |
| 4,471,298 | 9/1984 | Frohlich | 324/158 F |

FOREIGN PATENT DOCUMENTS

| | | | |
|---|---|---|---|
| 0155742 | 9/1982 | Japan | 324/158 F |
| 0169922 | 10/1983 | Japan | 324/158 F |

OTHER PUBLICATIONS

Hogan et al., "Precision . . . "; IBM Tech. Dis. Bull.; vol. 17; No. 3; Aug. 1974; pp. 880–881.
Schwarz, W.; "Rotatable . . . "; IBM Tech Dis. Bull.; vol. 21; No. 10; March 1979; pp. 4086–4087.
Gagne, et al; "No-Edge . . ."; IBM Tech. Dis. Bull.; vol. 17; No. 8; Jan. 1975; pp. 2220–2221.

Primary Examiner—Ernest F. Karlsen
Attorney, Agent, or Firm—Flehr, Hohbach, Test, Albritton & Herbert

[57] ABSTRACT

An automatic system for performing sheet resistivity testing on surface layers of semiconductor wafers, including a wafer handling stage having a platform for carrying a semiconductor wafer, and an arrangement for mounting the platform for rotation about a central axis and for translation of the platform orthogonal to a major surface thereof. A platform drive translates the platform between a wafer test position and a wafer load position, and a stage drive rotates the platform to accurately located angular test positions. A probe handling arrangement includes a carriage for carrying a test probe parallel to the major surface of a wafer on the platform and a carriage drive translates the carriage between a parked position in which a test prove thereon is positioned adjacent and clear of the platform and accurately located test positions along a radius of the platform. The carriage carries a resistivity test probe which includes test probe element for contacting the surface of a semiconductor wafer. A light tight housing surrounds the platform and includes an access door therein facing the platform and positioned intermediate the wafer load position and the wafer test position of the platform. The access door translates under controlled motor drive between a closed position and an open position which permits the platform to translate between the wafer load and wafer test positions. Sensor arrangements cooperate with a safety inhibit circuit to preclude destructive movement of components when position conflict is sensed. All movements and measurements are under microcomputer control.

21 Claims, 15 Drawing Sheets

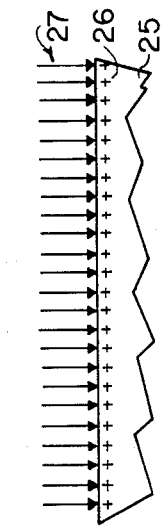
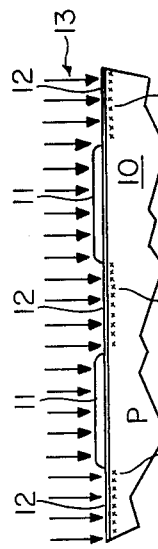
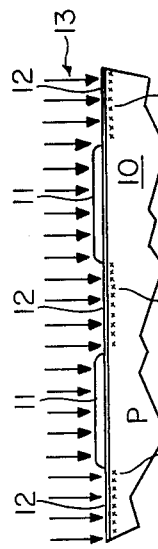
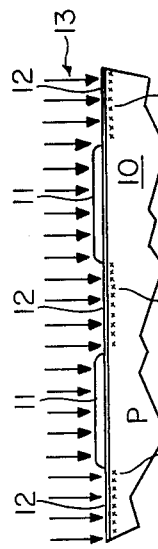
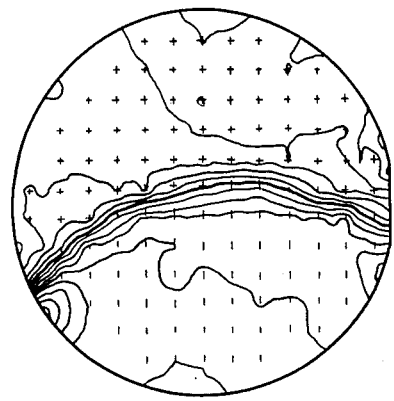
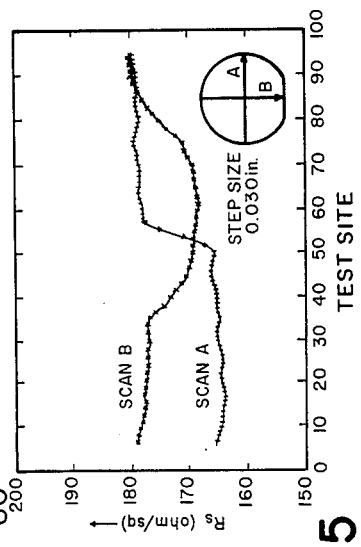
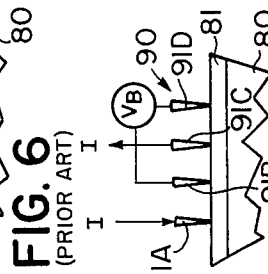
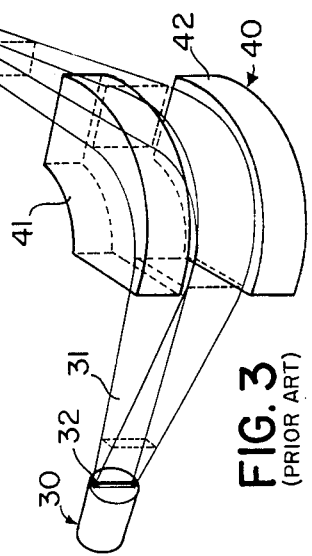

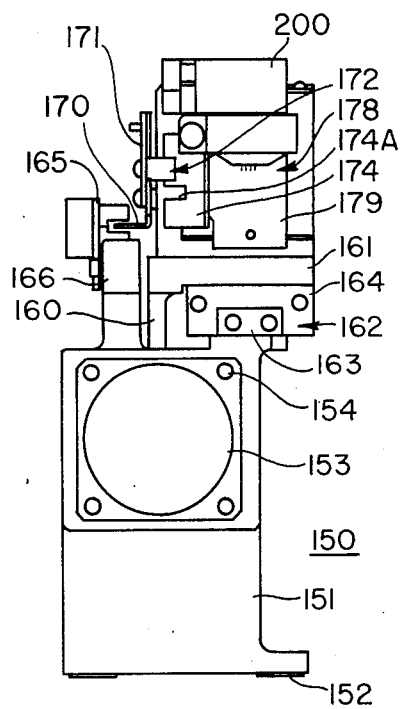
FIG. 24
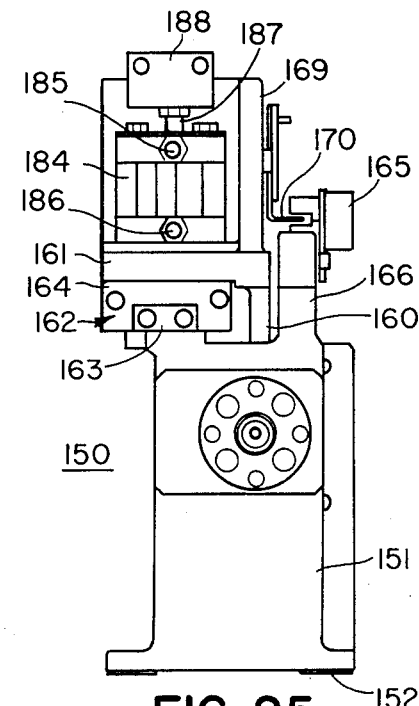
FIG. 25
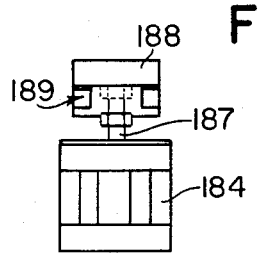
FIG. 26
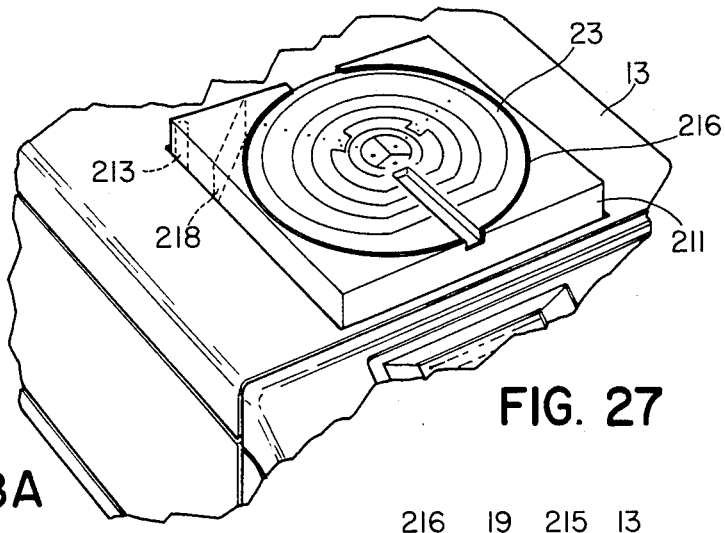
FIG. 27
FIG. 28A
FIG. 28

APPARATUS AND METHODS FOR SEMICONDUCTOR WAFER TESTING

This invention relates generally to apparatus and methods for testing semiconductor wafers to ascertain physical and electronic characteristics thereof. This invention also relates to apparatus for automated handling and positioning of workpieces such as semiconductor wafers. In a specific embodiment, this invention relates to systems and methods for sheet resistance mapping of semiconductor wafers to test the performance of semiconductor wafer manufacturing equipment utilized to form surface layers of specific target conductivity value as part of the process of manufacturing semiconductor devices such as, for example, large scale integrated circuits.

The invention described in this specification may be applied generally in the testing of semiconductor wafers utilizing testing processes carried out in a contact or non-contact mode, i.e., utilizing test probes of the type which require contact with the surface of the semiconductor wafer or test probes which perform their testing function in a position adjacent to, but not in contact with, the surface of the wafer. To understand the importance of the invention to the semiconductor industry, it will be helpful to first consider some background information on the status of the industry and the particular importance of performing automated resistivity testing on semiconductor wafers which have been subjected to ion implantation.

Large scale integrated circuits involve the integration on a single semiconductor chip of a large number of individual semiconductor devices which are interconnected into a completed circuit. Very great improvements in the scale of integration of semiconductor devices on integrated circuit (IC) chips and the speed of operation of such devices have been achieved over the past several years. In other words, improvements have resulted in substantially increased numbers of individual semiconductor devices being formed in the same area of a semiconductor chip. These improvements have been made possible by a number of advances in integrated circuit manufacturing equipment as well as improvements in the materials and methods utilized in processing virgin semiconductor wafers into IC chips. The most dramatic advances in manufacturing equipment have been improved apparatus for lithography and etching which define the device and circuit patterns and improved systems for implanting of conductivity modifying impurities into the semiconductor wafer.

Generally, the density of integrated circuits and their speed of operation are dependent largely upon the accuracy and resolution of the lithography and etching apparatus used to form the patterns of circuit elements in masking layers on the semiconductor wafer. However, density and speed are also dependent upon tight control of the profile of doped regions in the wafer, that is, regions to which substantial concentrations of conductivity modifying impurities have been added. Tight control of wafer doping can best be achieved in today's technology using ion implantation techniques and equipment. When ion implantation equipment is operating properly, highly uniform doping of the semiconductor wafer can be achieved. This will result in high yield of properly working integrated circuits if other aspects of semiconductor processing are properly carried out. However, if the ion implantation equipment is malfunctioning so that improper or non-uniform dosages are present in the semiconductor wafer, the yield of properly working integrated circuit devices will fall off dramatically. Thus, it has become increasingly important in controlling the quality and yield of semiconductor processing to have effective in-process control monitoring of the proper operation of ion implantation systems.

FIGS. 1A–1C illustrate the use of a sequence of ion implantation steps in fabricating conductor-insulator-silicon integrated circuit devices on a semiconductor wafer. FIG. 1A illustrates a first ion implantation step which may be performed on the P-type wafer 10 to produce a light implant in the field regions 14 of the wafer. Field regions 14 are defined at this point as the regions of the wafer which are not covered by the regions of photoresist 11. These regions of photoresist 11 are formed using a standard lithography process in which a thin layer of photoresist is spread over the entire surface of the wafer and then selectively exposed through a mask pattern or a directly scanned and modulated electron beam. This is followed by a developing step which removes areas of the photoresist which have been exposed to the light or to the electrons. A thin layer of thermal oxide 12 may be present over the exposed surfaces of the semiconductor so that the ion implantation in the field regions 14 will be made through the thin oxide layer.

A light implantation of ions of a P-type material such as boron (represented by the sequence of arrows designated 13) is performed using an ion implantation system. This field implant is done to provide greater electrical isolation between the active device regions which lie under the regions 11 of photoresist material.

After the implantation steps shown in FIG. 1A, wafer 10 is typically placed in a furnace and thick field oxide regions 15 are grown in a wet oxidization process. During this oxidization process, the implanted ions 14 are driven into the semiconductor substrate to underlie the field oxide regions 15.

FIG. 1B shows a second ion implantation step, represented by the arrows designated 16, to implant an N-type dopant material, such as phosphorus, into the active device regions 18 of the wafer 10. This implant controls the threshold voltage of the transistor devices to be formed in the active device regions.

FIG. 1C illustrates a third ion implantation step in which a heavy implantation of N-type ions is performed to drop the source and drain regions 21 and 22 of the active semiconductor device elements. This heavy implant of N-type ions is represented by the arrows 20.

Since there are thousands of active device regions on each integrated circuit chip and usually hundreds of integrated circuit chips on each wafer, it will be appreciated that the accuracy and uniformity of ion implantation doping of the semiconductor wafer during each implant is critical to achieving a good yield of working integrated circuit chips in some semiconductor processes, as many as thirteen separate ion implantation steps are required in the fabrication process. A number of other processing operations are performed on a water after the step shown in FIG. 1C to complete the basic device structure and to interconnect the various semiconductor devices.

From the above brief explanation, it should be apparent that proper operation of the ion implantation equipment is a very critical element in successful fabrication of integrated circuit devices. Higher and higher levels of integration require greater and greater accuracy in each processing step and this can be assured only by regular in-process checking of the operation of the semiconductor equipment performing the various processing steps.

Resistivity mapping of test wafers has proven to be a very useful process control mechanism for characterizing the accuracy and uniformity of implant dosages supplied by the ion implant apparatus. FIG. 2 illustrates the uniform doping of the entire surface region 26 of a semiconductor wafer 25 with implanted ions represented by the arrows 27. Wafer 25 is strictly a test wafer which is processed through the ion implantation equipment, without lithography or other steps, simply to check the uniformity and accuracy of implant dosage in the implanted surface region 26 of the wafer.

FIG. 3 illustrates schematically the elements of an ion implantation system including an ion source arrangement 30 and analyzing magnet arrangement 40, a resolving slit arrangement 50, a post-acceleration system 60, and a wafer processing system 70. Ions which are generated in the ion source 30 are extracted to produce a ribbon beam directed to the pole gap of the analyzing magnet 40. In the pole gap between the upper pole 41 and the lower pole 42, the ions in the ion beam 31 are sorted according to their charge-to-mass ratio. The analyzing magnet system 40 converges the beam elements having the selected change-to-mass ratio and focuses the selected beam through the aperture 51 in resolving slit arrangement 50. The resolved ion beam enters a post-acceleration system 60 where the ions are accelerated to a prearranged energy before striking the wafer 71 which is mounted on a heat sink arrangement 72 in the wafer handling apparatus 70.

The wafer handling apparatus 70 scans the wafers with respect to the ion beam in a two-dimensional pattern to provide uniformity of exposure of the entire wafer surface to the ions of the beam. (In other types of systems, the wafer itself is scanned with respect to the wafer in one or two directions.) The control system for the ion implanter maintains uniformity of ion beam current. The combination of uniformity of beam current and uniformity of wafer scan produces uniformity of doping in the semiconductor wafer. However, if the scanning of the wafer with respect to the beam is non-uniform or the beam current magnitude varies substantially during the implant process, non-uniformity of implant dosages will be present across the surface of the semiconductor wafer. By detecting such problems before the malfunctions reduce in-process yields, the equipment can be repaired before wafer processing continues.

The correctness and uniformity of implant dosage across the semiconductor wafer can be determined in an automatic sheet resistance mapping system which has the capability of taking multiple test readings in both a contour map and diameter scan mode. It is well-known in the prior art to utilize an in-line four-point probe to make sheet resistance measurements at various preselected testing location on the implanted semiconductor test wafer. Sheet resistance mapping and the theory and results of such testing techniques are discussed in detail in the following papers and publications, which are incorporated herein by reference:

D. S. Perloff et al., "Dose Accuracy and Doping Uniformity of Ion Implantation Equipment," *Solid State Technology*, February 1981, pp. 112–120;

Andrew B. Wittkower, "The Effect of Ion Implanter Design Upon Implant Uniformity," *Solid State Technology*, September 1982, pp. 77–81;

David S. Perloff, "Four-Point Probe Correction Factors for Use in Measuring Large Diameter Doped Semiconductor Wafers," *Journal of the Electrochemical Society: Solid-State Science and Technology*, November 1976, pp. 1745–1750; and D. S. Perloff, et al., "Contour Maps Reveal Non-Uniformity in Semiconductor Processing," *Solid State Technology*, February 1977.

FIG. 4 illustrates a printout of a contour map which shows a pattern of non-uniform implantation of a wafer. The heavy contour line represents the mean resistivity value of the wafer. The lighter contour lines outline regions which differ from the mean value by a preset percentage. The + and − symbols represent test sites for which the resistivity value is above and below the mean value, respectively. FIG. 5 illustrates a printout of two diameter scans on the same wafer. Here the actual resistivity values are plotted as a function of position of the test site on the diameter of a wafer. From these tests and printouts, the engineer in charge of a process can determine whether the ion implantation equipment is operating properly. Specific discussion of the diagnostic capability of the resistivity tests is contained in the above-referenced articles.

FIGS. 6 and 7 illustrate the two configuration resistivity probing techniques which are preferred for accuracy in making sheet resistance measurements on a semiconductor test wafer. The four points of the probe 90 are shown in contact with the surface layer 81 of a semiconductor test wafer 80. A four-point probe is a mechanical device consisting of four spring-loaded metallic probe tips 91A–91D which are brought into contact with the surface of the wafer.

FIG. 6 shows a standard probe configuration in which a constant electrical current is introduced into the wafer through the outer probe tips 91A and 91D, and the voltage drop is measured across two inner probe tips 91B and 91C. In FIG. 7, an alternate probe configuration is shown in which the constant current is introduced through probe tips 91A and 91C and the voltage drop is measured across probe tips 91B and 91D. Use of these two test measurements makes it possible to determine sheet resistance to a high degree of accuracy even at testing positions which are near the edges of the semiconductor wafer.

In a co-pending and commonly assigned patent application entitled "Apparatus and Methods for Resistivity Testing," Ser. No. 704,296, filed Feb. 22, 1985, a novel arrangement for orienting the resistivity test probe for improved accuracy in performing four-point probe sheet resistance measurements on conductive surface layers of a semiconductor wafer is disclosed. The specification of that application is hereby incorporated by specific reference.

The automated resistivity tester which has been essentially the industry standard for a number of years is the Kokusai Model VR30A resistivity tester. In this Kokusai system, the wafer platform is arranged to translate between a wafer load position directly in front of the main front wall of a light tight enclosure and a wafer home position in which the wafer platform is located entirely within the light tight enclosure and a stationary probe head mounted in a cantilevered fashion over the platform is positioned at the precise center of the wafer platform. The test probe remains stationary and the wafer platform is arranged to rotate to accurately located angular orientations so that both diameter scans and contour scans of a semiconductor wafer on the platform can be performed. Moving between a wafer load position and the home position of the wafer platform, the wafer platform moves through a swinging door arrangement in the main front wall of the enclosure.

While the Kokusai system functions in a generally satisfactory manner, there are a number of disadvantageous aspects of the wafer handling technology provided therein. First, it is difficult to interface the Kokusai unit to an automated wafer handling system for loading the wafers onto the wafer platform. The automated wafer loading system must either be placed directly in front of the test system enclosure or in some other position near the front of the unit where it tends to interfere with the operating controls of the system. Use of an r, θ wafer stage together with a stationary probe head requires that the overall apparatus for translating the wafer stage between a wafer load position and home position consume a large area of the overall test bench footprint of the system. The requirement that the wafer stage move out of the front enclosure wall limits the overall system enclosure volume which is available for packaging the electronics. Thus, the Kokusai system incorporates a separate electronics module to which the signals from the wafer handling and probing equipment are coupled.

Because the Kokusai unit uses a separate electronics housing remote from the wafer handling and probing module, three 50-pin ribbon cables are required to couple signals between the two units. These cables tend to pick up noise signals which can interfere with proper operation of the system, producing inaccurate test readings or signal glitches which cause the overall system to stop functioning in the middle of a test program.

The design of the Kokusai system results in a substantial problem with particulate generation which can adversely affect measurement accuracy. The hinged door through which the wafer passes, the grease on the open leadscrew and bearing assembly and the movement of the top enclosure hinged over the wafer stage are all sources of particulates which can end up on the water being tested.

Because the wafer stage is translating back and forth, the vacuum hoses connected thereto to hold the wafer in position on the wafer stage platform are required to move as well. Finally, the design of the Kokusai system makes it impracticable to enlarge the wafer stage to handle the larger diameter wafers which are a continuing trend in the semiconductor industry. It should thus be apparent that there is a need for an improved wafer handling system for automated semiconductor wafer testing systems.

It is a principal object of this invention to provide an improved wafer handling and positioning system for semiconductor testing systems.

It is another object of this invention to provide an improved apparatus for handling semiconductor wafers with greater ease of interfacing to automated wafer handling equipment.

It is another object of this invention to provide an improved automated sheet resistance mapping system.

It is another object of this invention to provide an improved wafer handling apparatus for an automated sheet resistance mapping system to enable the entire system to be housed within a single enclosure.

It is a further object of this invention to provide a wafer handling apparatus for wafer test equipment which is easier for the operator to use.

The above-stated objects of this invention are achieved in part using a workpiece handling system which utilizes a workpiece manipulation stage which has the capability of translating a workpiece vertically between stage down and stage up positions and of rotating the workpiece about a central axis of the stage. The workpiece handling stage comprises a hollow cylindrical housing with a hollow cylindrical rotor mounted within the housing and carried on a pair of upper and lower bearing assemblies to provide free rotary motion of the rotor within the housing. A cylindrical piston is mounted within the rotor and has one end thereof extending above the rotor to carry a platform for the workpiece. The piston is keyed to the rotor with a cooperating key and keyway arrangement so that the piston rotates with the rotor. A first drive arrangement communicates with the piston to drive the piston out of and into the rotor and thereby to translate the workpiece holding platform between the stage up and stage down positions. A second drive arrangement communicates with the rotor to produce rotation thereof within the housing.

In a preferred embodiment the piston is a hollow piston with the interior thereof communicating with a source of vacuum. The platform includes an arrangement of interconnected grooves formed in the top face thereof and a central aperture extending through the platform to communicate with the interior of the piston to couple the vacuum to the grooves to hold the workpiece on the platform.

According to another aspect of this invention, the above-stated objects are achieved in an automatic testing system for semiconductor wafers which comprises a stage arrangement including a platform for carrying a semiconductor wafer. A mounting arrangement is provided for the platform which enables rotation of the platform about a central axis and translation of the platform orthogonal to a major surface of the platform. A platform drive arrangement is coupled to the mounting arrangement to drive the platform between a wafer test position (i.e., stage down) and a wafer load position (i.e., stage up). A stage drive arrangement is coupled to the mounting arrangement for rotating the wafer platform to accurately located angular test positions. A probe handling arrangement is provided and includes a carriage arrangement for carrying a test probe parallel to the major surface of a wafer carried on the platform and a carriage drive arrangement for translating the carriage arrangement between a parked position in which a test probe thereon is positioned adjacent and clear of the platform and accurately located test positions along a radius of a wafer on the platform.

When adapted for carrying out tests which require the test probe element to contact the surface of a semiconductor wafer, the carriage means includes a probe arm for carrying a test probe and an arm mounting arrangement for mounting the probe arm in a cantilevered manner at one end for translation orthogonal to the wafer platform between probe up and probe down positions. In this arrangement a probe drive arrangement is coupled to the probe arm to drive the probe arm between the probe down and probe up positions.

The preferred embodiment of this invention also features a sensor and function inhibit arrangement which precludes the operation of various aspects the drive arrangements under conditions when damage to one of the components of the system could result. For example, in the broadest context, the sensor arrangement includes a probe location sensor associated with the carriage for sensing when the test probe arrangement is in the parked position and a platform position sensor arrangement associated with the wafer handling stage for sensing when the platform is in the wafer test position. A control circuit is coupled to the platform and stage drive arrangements for controlling the operation thereof. Coupled between the control circuit and the platform and stage drive arrangements is an inhibit circuit which is also coupled to the probe location and platform position sensors for sensing the state of these sensors. The inhibit circuit inhibits operation of the platform drive means (i.e., the one that controls raising and lowering of the wafer stage) except when the probe location sensor signals that the carriage arrangement is in the parked position. The inhibit arrangement also inhibits operation of the carriage drive which causes the translation of the carriage except when the platform position sensor senses that the wafer platform is in the wafer test position (i.e., stage down).

In a system in which the test probe is intended for contacting a semiconductor wafer on the wafer platform, a probe status sensor arrangement is provided for sensing when the probe arm is in the probe up position. The inhibit arrangement further inhibits operation of either the platform or stage drive arrangement except when the probe status sensor senses the probe arm is in the probe up position.

In an embodiment of the invention which mounts the wafer stage in a light tight enclosure with an access door immediately above the wafer stage platform, a door drive arrangement is provided for moving the door between open and closed positions and a door sensor system is provided for sensing when the access door is in full open position so that it is safe to raise the platform to the stage up (wafer load/unload) position. In this embodiment, the inhibit circuit arrangement is also coupled to the door sensor arrangement so that the platform drive arrangement is inhibited except when the probe location sensor senses that the carriage means is in the parked position and the door sensor senses that the door is in the full open position.

Another aspect of this invention features an arrangement for determining the position of a wafer on the wafer platform and the size of the wafer on the wafer platform. This aspect of the invention features a reflection sensor mounted on the carriage arrangement at a prearranged position proximate the prearranged location of the test probe for detecting when the sensor is positioned at the edge of a wafer on the platform as the test probe is scanned from the parked position toward the center of the wafer and vice versa. A control circuit is coupled to the sensor and to the platform stage and carriage drive arrangements for operating all of the drive arrangements in a prearranged sequence while monitoring the output of the sensor to determine the radial and angular coordinates (r, $\theta$) of at least three separate edge points of the wafer and to determine from those coordinates the actual radial and angular coordinate of the center of the wafer and also the size of the wafer itself.

The workpiece staging system of this invention has the advantage of compactly carrying a workpiece between a load position in which the stage is up and a workpiece operate (stage down) position while also providing for rotation of the workpiece about a central axis of this stage. As applied to handling semiconductor wafers, this capability dramatically adds to the convenience of wafer handling for the operator since the wafer stage is presented to the user at a top surface of the system where it is very convenient for the user to manually load and unload the wafers. Furthermore, the wafer staging system is easily interfaced to existing automated wafer handling systems which can be mounted adjacent the housing which encloses the entire test system and still have convenient access from a number of angles to the wafer stage platform.

By providing for translation of the probe head relative to the wafer platform, instead of translating the wafer platform relative to the probe head, a much more compact arrangement of the wafer stage and the probe scanning mechanisms can be achieved. This permits the packaging of all of the electronics of an automated resistivity tester, for example, inside a single enclosure with all the attendant advantages and conveniences. Signal leads are shorter, leading to greated noise immunity and connection reliability.

Economy of motion is achieved by having the wafer platform translated only a short distance between a stage down and stage up position. The z, $\theta$ stage of this invention has much quieter operation. Furthermore, the provision of an arrangement for translating the probe head relative to the wafer platform requires that a smaller mass be moved to scan the probe head relative to the wafer. This results in quieter, quicker and more accurate test probe positioning relative to the semiconductor wafer on the platform.

The overall z, $\theta$ stage and the z, r probe stage of this invention provide a convenient arrangement for incorporating optical sensors to report on the position status of the various components and for ease of integration of the outputs of these sensors into a safety interlock or inhibit system which precludes destructive modes of operation of the system.

The overall system of this invention reduces the particulate sources in the vicinity of the wafer platform. The wafer platform is maintained by itself within a small light tight enclosure and no greasebearing surfaces enter that enclosure. The cover or door is mounted on ball slides which face away from the enclosure so that any particulates generated will fall outside this separate enclosure.

Other objects, features and advantages of this invention will be apparent from a consideration of the detailed description given below in conjunction with the accompanying drawings.

FIGS. 1A–1C illustrate process steps in the manufacture of a semiconductor integrated circuit utilizing various ion implantation steps.

FIG. 2 illustrates ion implantation of a test wafer for testing uniformity of the ion implant dosage across the entire surface.

FIG. 3 is a schematic illustration of ion implantation apparatus of the prior art.

FIGS. 4 and 5 illustrate a contour map and a diameter scan which are examples of the types of test results produced by the system of this invention.

FIGS. 6 and 7 illustrate alternate in-line test probe measurements in accordance with the prior art.

FIG. 19 is a partial elevational view of the rotor of the z, θ stage taken along the lines 19—19 in FIG. 12.

FIG. 24 is a right hand end view of an r, z stage in accordance with this invention.

FIG. 25 is a left hand end view of an r, z stage in accordance with this invention.

FIG. 26 is a detailed view showing a probe down sensor arrangement in accordance with this invention.

FIG. 27 is a partial perspective view of an automated semiconductor wafer testing system showing an optional protective traveling shroud.

FIG. 28 is a partial section view showing the structural arrangement of the optional traveling shroud.

FIG. 28A is a partial view of the shroud guide pin and channel arrangement taken along the lines A—A in FIG. 28.

Since FIGS. 1–7 have been described in the introductory portion of this specification, further description thereof is unnecessary at this point.

Figure 8:
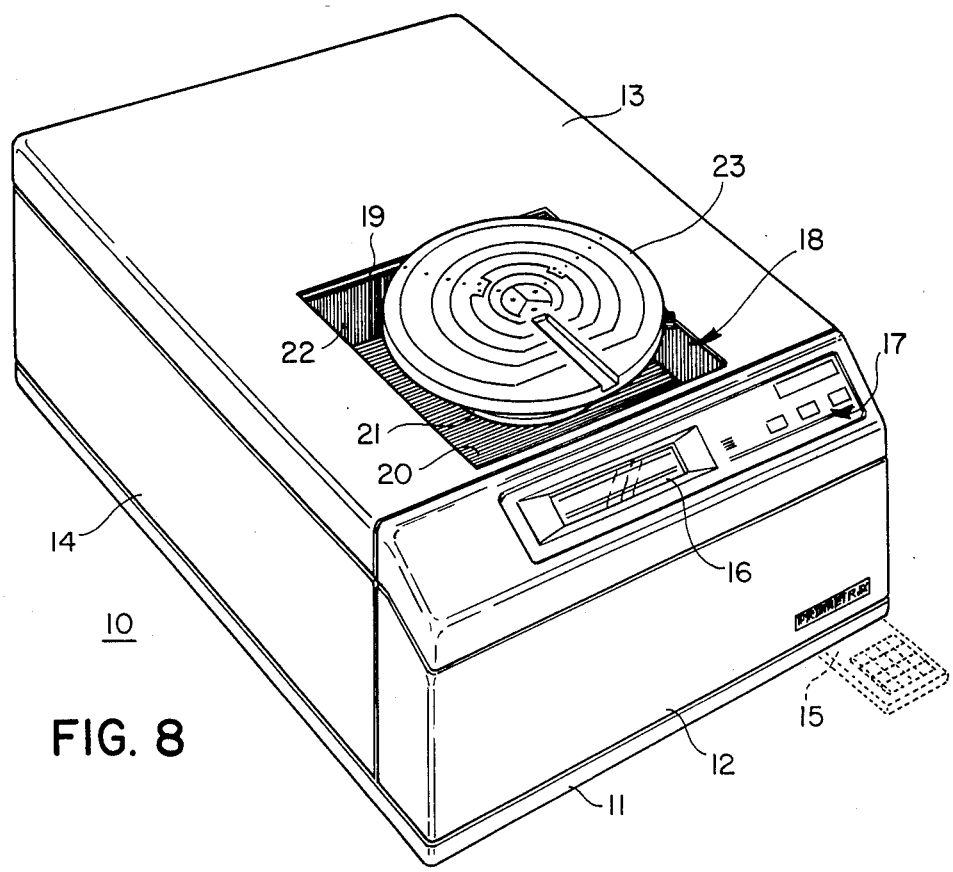
FIG. 8 is a perspective view of an automated semiconductor wafer testing system in accordance with this invention.

FIG. 8 depicts a perspective view of an automated resistivity test system which is the currently preferred embodiment of the wafer handling and probing features of this invention. The general concepts and features of this invention will be described in terms of the preferred embodiment of an automated resistivity test system. However, it should be understood that the features of this invention are readily adaptable to other types of semiconductor wafer testing including capacitance-voltage measurements, film thickness measurements, and acoustic coupled lifetime measurements. The techniques of acoustic coupled lifetime measurements were described in a paper given at an ASEE Technical Session in January 1985 by R. Bharat et al. Various types of film thickness measurements can be utilized, including color comparison, variable angle monochromatic fringe observation, constant angle reflection interference spectroscopy, and ellipsometry. These various film thickness tests are described by William A. Pliskin and Stelvio J. Zanin in "Film Thickness and Composition," Chapter 11 of the *Handbook of Thin Film Technology*, edited by Maissel and Glong (McGraw-Hill 1970).

Figure 9:
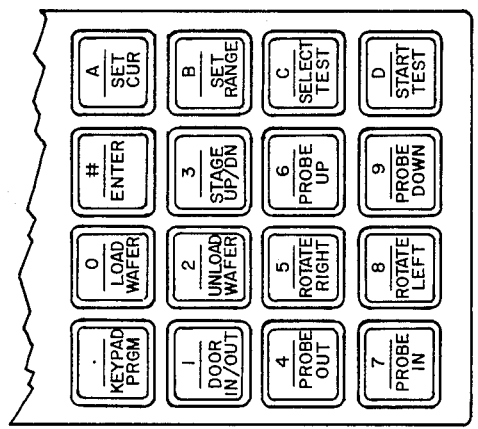
FIG. 9 is a key pad layout useful in the system depicted in FIG. 8.

The automated resistivity test system 10 depicted in FIG. 8 places all of the mechanical and electrical hardware of the system in a single integrated enclosure which includes a base casting 11 to which is hinged at the front edge a front cover 12 which swings down to provide access to the front interior of the cabinet. A diagnostic panel (not shown) is preferably located inside the front cover. Top cover 13 and the side panels 14 are removable from the housing for access to the interior for servicing of the electrical and mechanical components contained therein. The cover, side and back panels are removably mounted on a steel frame (not shown). As FIG. 8 shows, an optional pull-out keyboard 15 may be provided in the base plate 11. This manual keyboard may have the key functions depicted in FIG. 9. With these key functions, the resistivity test system can be configured as a self-contained automated resistivity tester with limited overall test protocol features.

A liquid crystal display 16 is provided on the front cover 12 for displaying test parameters, test results, and status information. A more limited control panel 17 is provided with just a few control functions. More extensive system control keys may be included on this control panel for the self-contained automated resistivity tester mentioned above.

Top cover 13 has a rectangular opening 18 formed therein and a sliding cover or door 19 is provided to complete a darkened light tight enclosure into which the wafer holding platform 23 drops after a wafer (not shown here but described below) is loaded thereon. The bottom panel 20 of the light tight enclosure admits the piston (not shown) which is utilized to raise and lower the wafer platform 23. The back wall 22 of the light tight enclosure has an opening (not shown) therein through which a probe and probe arm can extend to test a wafer on the wafer platform 23 when it is in its stage down position proximate the bottom plate 20 of the light tight enclosure. The various details of the motion of the wafer carrying platform 23 will be discussed in detail below. An optional traveling shroud arrangement shown in FIGS. 27 and 28 will also be described below.

Figure 10:
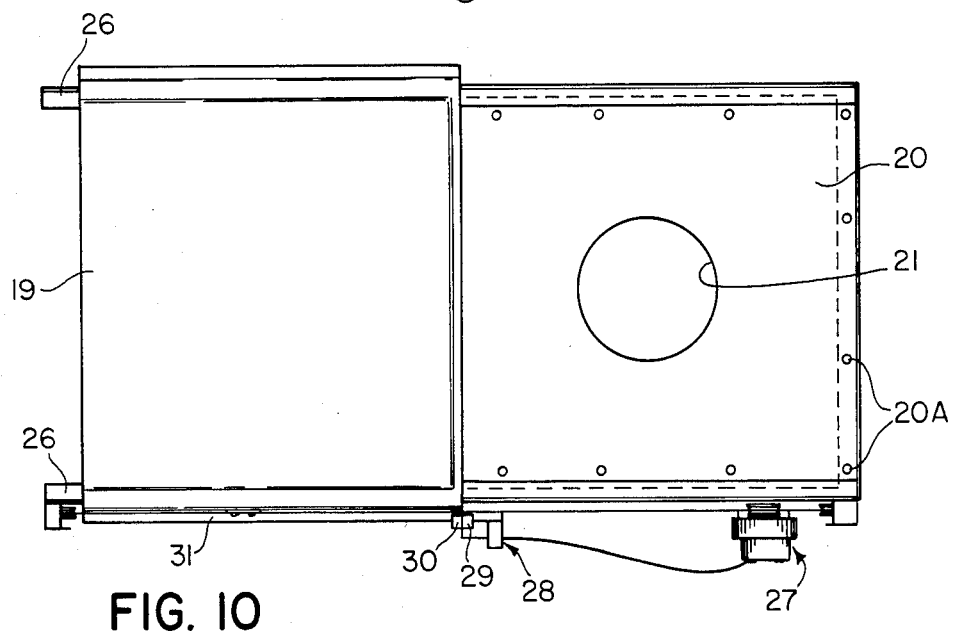
FIG. 10 is a top plan view of a sliding cover arrangement useful in the system depicted in FIG. 8.

FIG. 10 illustrates a form of a slide mounting arrangement for the door 19 which includes a pair of ball bearing slide arrangements 26 to which the door 19 is mounted for free sliding motion between a door open position depicted in FIG. 10 and a door closed position in which the door 19 has been transported to the right to complete the light tight enclosure. A motor and pulley arrangement 27 operates under command of a control circuit which provides motor direction and motor enable commands to drive the door back and forth between the open and closed positions.

A door position sensor arrangement 28 is provided to report the position of the door 19. A pair of optical sensors 29 and 30 function together with a position flag 31 to report when the door is in a fully open position, a fully closed position, or in transition therebetween. The flag 31 is arranged such that, in the fully open door position, the right hand portion of the flag covers the optical sensor 30 and uncovers the optical sensor 29. Each of the optical sensors 29 and 30 is preferably a light emitting diode (LED)-phototransistor combination which is considered ON when light is received from the LED by the phototransistor and OFF when the light is blocked. When the door 19 is in its fullly closed position, the left portion of the flag 31 covers the optical sensor 29 and uncovers the optical sensor 30. In the transition period, both optical sensors 29 and 30 are covered. Use of the output of the optical sensors 29 and 30 as part of an overall safety inhibit or interlock circuit arrangement is discussed below.

Figure 11:
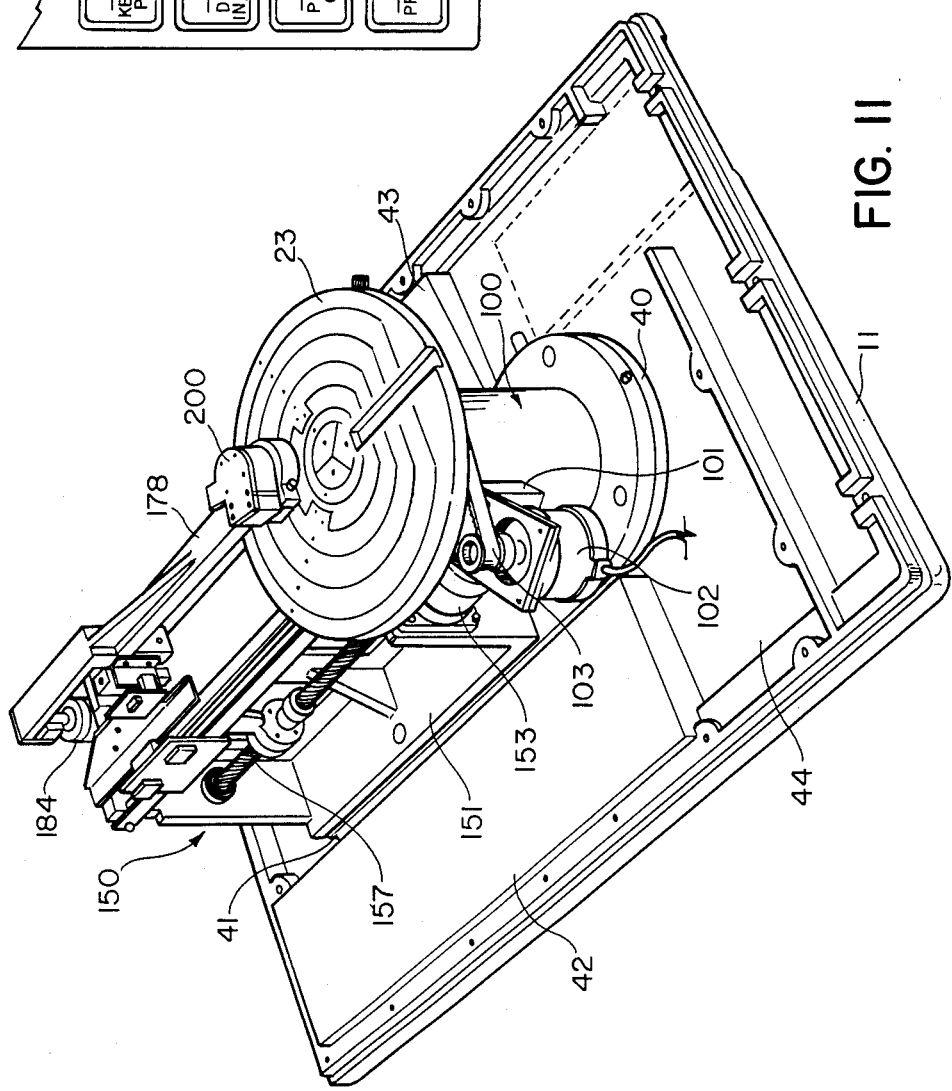
FIG. 11 is a perspective view of the major components of the wafer stage and probe handling modules of the wafer testing system depicted in FIG. 8.

As depicted in FIG. 10, the bottom wall 20 of the light tight enclosure is mounted to a supporting frame 20A for the bottom and side walls utilizing screws 20A. The bottom wall can thus be removed after the wafer platform 23 is removed from the piston which carries it up and down. Thereafter, access to the z, $\theta$ stage which forms a major component of this invention is provided so that this entire stage can be removed for any service which it may require. FIG. 11 shows a perspective view of the major components of the electromechanical modules of the automated tester system in accordance with this invention. Mounted to the base plate 11 on a pedestal 40 is a wafer stage arrangement 100 which includes platform 23 for carrying a semiconductor wafer, a stage mounting arrangement which mounts the stage arrangement for rotation of platform 23 about a central axis and for translation of the platform 23 orthogonal to the top surface thereof. As will later be seen, a platform drive arrangement is coupled to the overall mounting arrangement to drive the platform 23 between a wafer test position (stage down) and wafer load position (stage up). A stage drive arrangement comprising a motor 102 and a drive belt arrangement 103 is coupled to the mounting arrangement for rotating the wafer platform to accurately located angular test positions.

A probe handling arrangement 150 carries test probe 200 parallel to the major surface of a semiconductor wafer on platform 23 and includes a carriage drive arrangement comprising motor 153 and lead screw 157 (described in more detail below) for translating the carriage means between a parked position (in which the test probe 200 is positioned adjacent and clear of platform 23) and accurately located test positions along a radius of platform 23. As will be described in more detail later, the carriage means also includes a probe arm drive arrangement 184 coupled to the probe arm 178 to drive the probe arm between the probe down and probe up positions. In the probe down position, the probe contact pins are in contact with the surface of a semiconductor wafer on the platform 23. The carriage arrangement 150 is mounted to the base 11 on a platform 41.

Platforms 42 and 43 are utilized for mounting the card cages of the analog and digital circuitry utilized in the system along with the power supply for the analog and digital circuitry. The air and vacuum equipment may be mounted to the base plate 11 in the floor region 44. Pullout keyboard assembly 15 is positioned as shown when provided as part of the system.

The overall wafer stage arrangement 100 will be referred to as a z, $\theta$ stage since one motion of the platform 23 is in the z direction which is defined as the axis normal to the surface of the platform 23. The "$\theta$" designation refers to the rotation of the platform 23 about its center axis to precise angular coordinates relative to a home position which is defined by a position marker and an optical sensor arrangement which will be described below.

The probe handling arrangement 160 will be referred to as an r, z stage. The "r" designation refers to the movement of the carriage arrangement in a radial direction relative to the center of the platform 23. The "z" designation for this stage refers to the capability of moving the probe 200 in the z direction orthogonal to the platform 23 between probe down and probe up positions.

Figure 12:
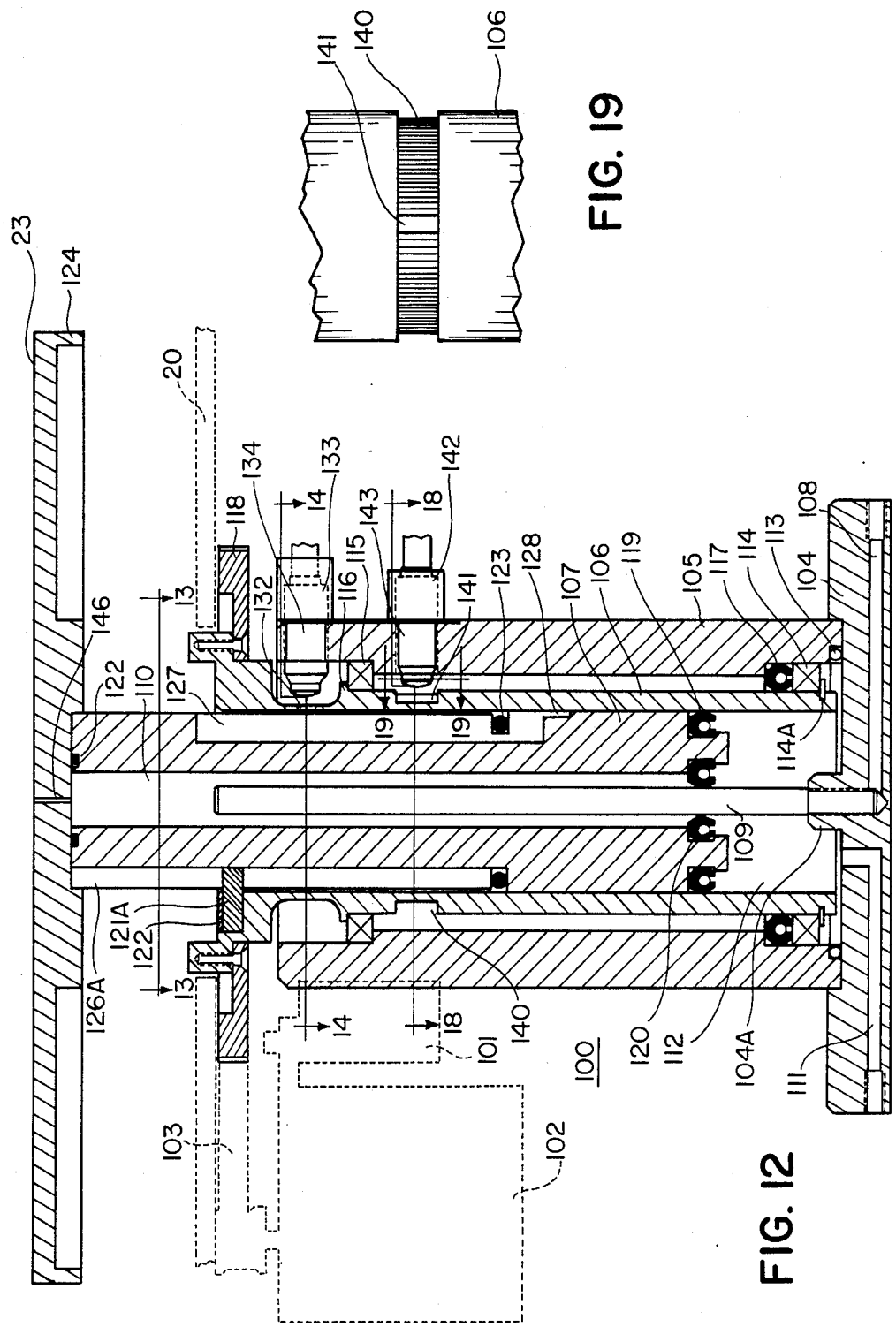
FIG. 12 is a sectioned elevational view of a z, θ wafer handling stage in accordance with this invention.

At the heart of the wafer handling, positioning, and probing system of this invention is the z, $\theta$ stage 100 which has unique structural and functional features now to be described in conjunction with FIGS. 12-21. Referring now to FIG. 12, the major components of the z, $\theta$ stage 100 are base plate 104, a hollow cylindrical housing 105, a hollow cylindrical rotor 106, and a hollow piston 107. Housing 105 is mounted in an accurately machined recess in the base 104 and is fastened to the base 104 with a plurality of machine screws (not shown) which extend from the bottom of the base 104 into drilled and tapped apertures in the side walls of housing 105. An o-ring 113 provides a seal against leakage of air from the interior 112 to the outside atmosphere at this mounting surface.

A channel 108 is provided in the base 104 to communicate with the central hub 104A into which a hollow stainless steel tube 109 is threaded. Channel 108 and hollow tube 109 communicate vacuum to the hollow interior 110 of the piston 107. This vacuum is communicated through an aperture 146 to an arrangement of grooves on the top surface of the wafer platform 124 as shown in detail in FIGS. 20 and 21 to be described below.

A second channel 111 is provided in the base 104 to communicate air under pressure to the open interior 112 underneath piston 107, thereby to drive piston 107 vertically between the stage down and stage up positions. Release of the air pressure in the channel 111 causes the piston 107 to drop of its own weight to the stage down position which is also the wafer test position of the platform 124.

Rotor 106 is mounted within housing 105 for free rotation on a pair of upper and lower bearing assemblies 114 and 115. A shoulder 116 on rotor 106 carries the weight of the rotor on the upper bearing assembly 115. A keeper ring 114A holds the lower bearing assembly 114 and the sealing ring arrangement 117 in position between the inner wall of housing 105 and the outer wall of rotor 106. A gear 118 is mounted with machine screws to a top flange on rotor 106 so that a drive belt 103 may be used to couple the gear 118 to a motor drive arrangement 102 mounted on a bracket 101. The sealing ring arrangement 117 is a special spring expansion sealing ring especially designed for air and vacuum pressure sealing. The sealing arrangement 117 remains stationary against the inner wall of housing 105 and the other wall of rotor 106 and rotor 106 rotates with respect to the sealing ring 117. This sealing arrangement precludes leakage of air from the interior cavity 112 under piston 107 through the annular space between the outer surface of the rotor 106 and the inner surface of the housing 105.

Piston 107 carries platform 124 on the top end thereof with an o-ring seal 122 preventing leakage of air past the mounting surface between the platform 124 and the piston 107. At the bottom end of piston 107, a pair of special spring expansion sealing rings 119 and 120 are mounted in grooves machined into the piston and held in place by shoulders formed on the bottom of the groove over which the sealing rings are fitted in the assembly process. The outer wall of piston 107 is machined to mate fairly accurately with the inner wall of rotor 106, but sealing ring 119 precludes having to do high accuracy matched machining of these pieces for metal-to-metal seal. Thus, sealing ring 119 precludes the escape of air from the interior 112 past any annular space between the outer wall of piston 107 and the inner wall of rotor 106.

The sealing ring arrangement 120 both seals and provides a sliding bearing surface for the vacuum in cavity 110 and the air pressure in cavity 112. Thus, as the piston 107 is raised by the air pressure in cavity 112, the sealing ring arrangement 120 rides along with the piston on the exterior surface of the hollow tube 109 to provide continual air/vacuum isolation. Since both the vacuum in cavity 110 to hold a wafer on platform 124 and air pressure in cavity 112 to raise the piston 107 are present at the same time, it is important that the sealing arrangement 120 provide good pressure isolation between the air pressure region 112 and the vacuum pressure 110.

Figure 13:
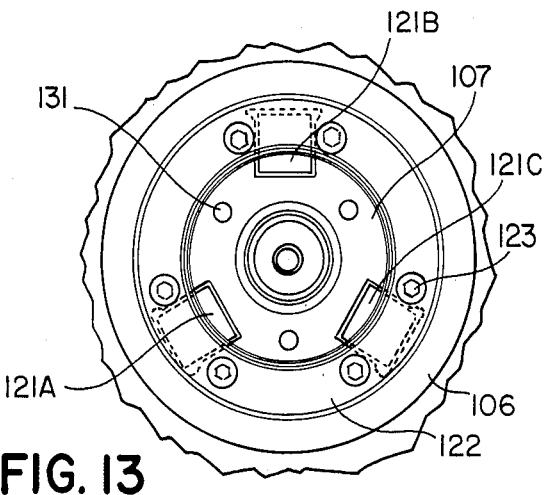
FIG. 13 is a partial top view of the z, θ stage depicted in FIG. 12 and taken along the lines 13—13.
Figure 15:
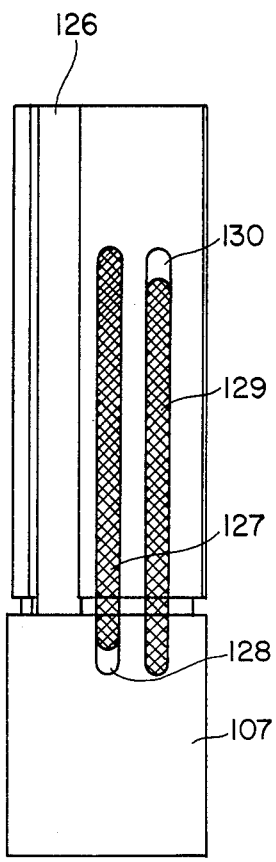
FIG. 15 is a side elevational view of the platform raising piston component of the z, θ stage depicted in FIG. 12.
Figure 14:
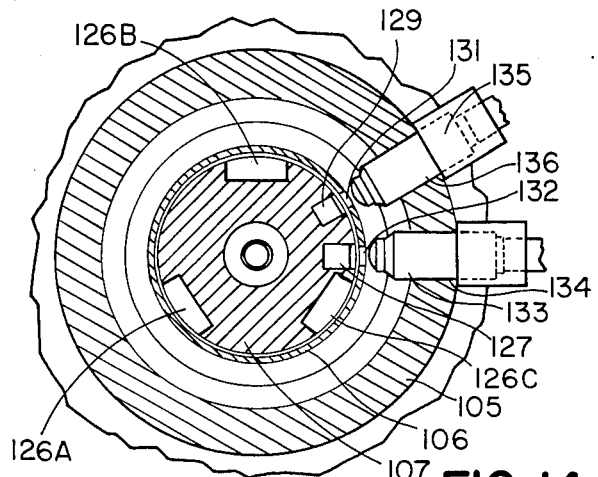
FIG. 14 is a partial section view through the z, θ stage taken along the lines 14—14 in FIG. 12.
Figure 16:
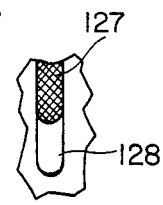
FIGS. 16 and 17 are detail views showing the position marking arrangement of the platform carrying piston depicted in FIG. 12.
Figure 17:
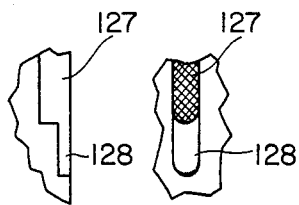

The reciprocating piston 107 is keyed to the rotor 106 utilizing a series of three keys 121A, 121B and 121C, (shown best in FIG. 13) and a plurality of keyways 126A, 126B, and 126C which are machined in the exterior walls of the piston 107. The position of these keys and keyways is purposely non-symmetric about the center axis of the z, θ stage so that the piston 107 can be mounted within the rotor 106 in only one orientation. This is required for the proper positioning of the piston position marker arrangement relative to the optical sensors as will be described below. A keeper ring 122 holds the individual keys 121 in position relative to the rotor 106 utilizing mounting screws 123. As shown in FIG. 13, a plurality of tapped holes 131 cooperates with machine screws (not shown) to mount the platform 124 in a removable fashion to the top of piston 107. An o-ring 123 is mounted in a groove in the exterior surface of piston 107 to provide a soft, silent stop in the stage up position of piston 107. The o-ring 123 contacts the bottom of the keys 121 as the piston rises and the bottom surfaces of the keys bottom out in the keyways.

The z, θ stage 100 includes optical sensor and position marker arrangements for sensing when the stage is in a home position relative to the angular position of the rotor 106 and for sensing when the piston 107 is in the stage up or stage down position. These features of the z, θ stage 100 will be described in conjunction with FIGS. 12-19. Consider first the position marker and optical sensor arrangement for detecting when the piston 107 is in the stage up or stage down position. As shown in FIGS. 12 and 14-17, a pair of grooves 127 and 129 are machined into the exterior surface of piston 107 to provide an optical position marker for the piston. Each of the grooves 127 and 129 has a non-reflective finish. A more shallow groove portion 128 is provided at the bottom of groove 127 and a more shallow groove portion 130 is provided at the top of groove 129. The surfaces of these groove portions 128 and 130 are provided with a light reflective surface.

A pair of optical sensors 133 and 135 are mounted in respective threaded apertures 134 and 136 formed in the wall of housing 105. The viewing end of optical sensors 133 and 135 looks through windows 131 and 132 provided in the wall of rotor 106. Accordingly, when rotor 106 is positioned in the home position (which will be described below), the optical sensors 133 and 135 view the grooves 127 and 129 through the individual windows 131 and 132. If piston 107 is in the stage up position, the reflective area 128 adjacent the groove 127 will be seen by the optical sensor 133. Thus optical sensor 133 will report with an output signal that the platform 124 and piston 107 are in the stage up position. When piston 107 is in the stage down position, the reflective area 130 adjacent groove 129 will be seen by optical sensor 135 which will, accordingly, send a signal reporting a stage down position. The optical sensors 133 and 135 comprise a combination of a light source and a light detector.

It should be noted that these position sensing arrangements are not intended to control the position of the piston and wafer platform but simply to report the position. The stage down position is determined by the wafer platform resting on the top of the rotary stage. The stage up position is determined when the keys 121 bottom on the keys ways 126.

It should be apparent that there are other types of sensor arrangements which could be used to report the stage up and stage down positions. For example, an arrangement of microswitches could be provided with appropriate actuators to report the stage up and stage down position. However, the optical sensor and position marker arrangement of this invention is preferred because, for example, it provides a more fail safe position sensing arrangement. From the above description, it should be apparent that an ON condition of sensor 135 coupled together with an OFF condition of sensor 133 signls the stage down position. Conversely, an ON condition of sensor 133 together with an OFF condition of 135 comprises the stage up reporting condition. When the piston 107 is in an intermediate location between the full up and full down positions, both of the optical sensors are OFF.

Accordingly, if optical sensor 135 malfunctions in a way that it stays off (the typical malfunction for this type of sensor), it will never report a stage up condition and the control system to which the sensors are attached will assume that the stage is in an intermediate position or in a stage down position if optical sensor 133 is ON. Similarly, if optical sensor 133 fails, the sensor arrangement will never report a stage down condition and the system will assume that the stage is in an intermediate position unless sensor 135 is ON. This is a fail safe arrangement since the sensor will never report an erroneous condition which could cause the system to take action relative to moving the probe head or closing the access door which could cause damage to one of these components.

Figure 18:
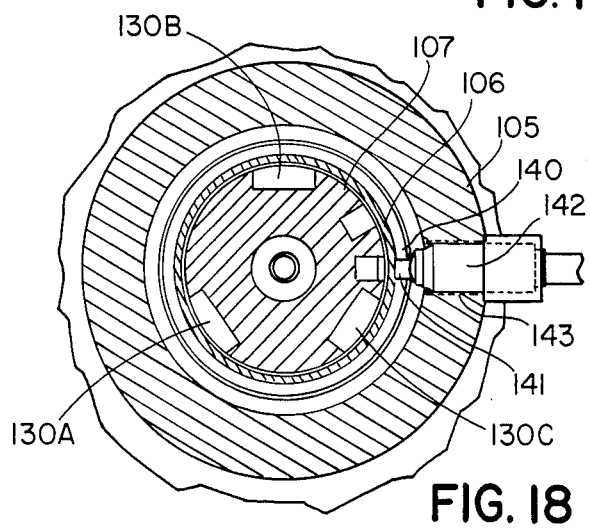
FIG. 18 is a section view through the z, θ stage of FIG. 12 taken along the lines 18—18.

Referring now to FIGS. 12 and 18, the home position sensing feature of this z, θ stage of this invention will be described. A groove 140 is machined in the exterior surface of rotor 106 and a reflective marker tab 141 is mounted in the groove 140 at the home position of the rotor 106. An optical sensor 142 is mounted in a threaded aperture 143 in the housing 105 in a position at the height of the center of the groove 140 and the rotor 106. The bottom surface of groove 140 is non-reflective so that only when the optical sensor 142 sees the reflective marker 141 does it send a signal output. An accurate home position for the 0 or angular position stage is accomplished by driving the stage in one direction until the left edge of the marker 141 is detected and the $\theta$ stage position is reported. The rotation of the stage continues until the right edge of the marker 141 is detected by the sensor by going OFF and the $\theta$ position of the right edge is registered. The rotor is then rotated back one-half the distance between the registered left and right edges of the marker 141 to the home position.

Figure 20:
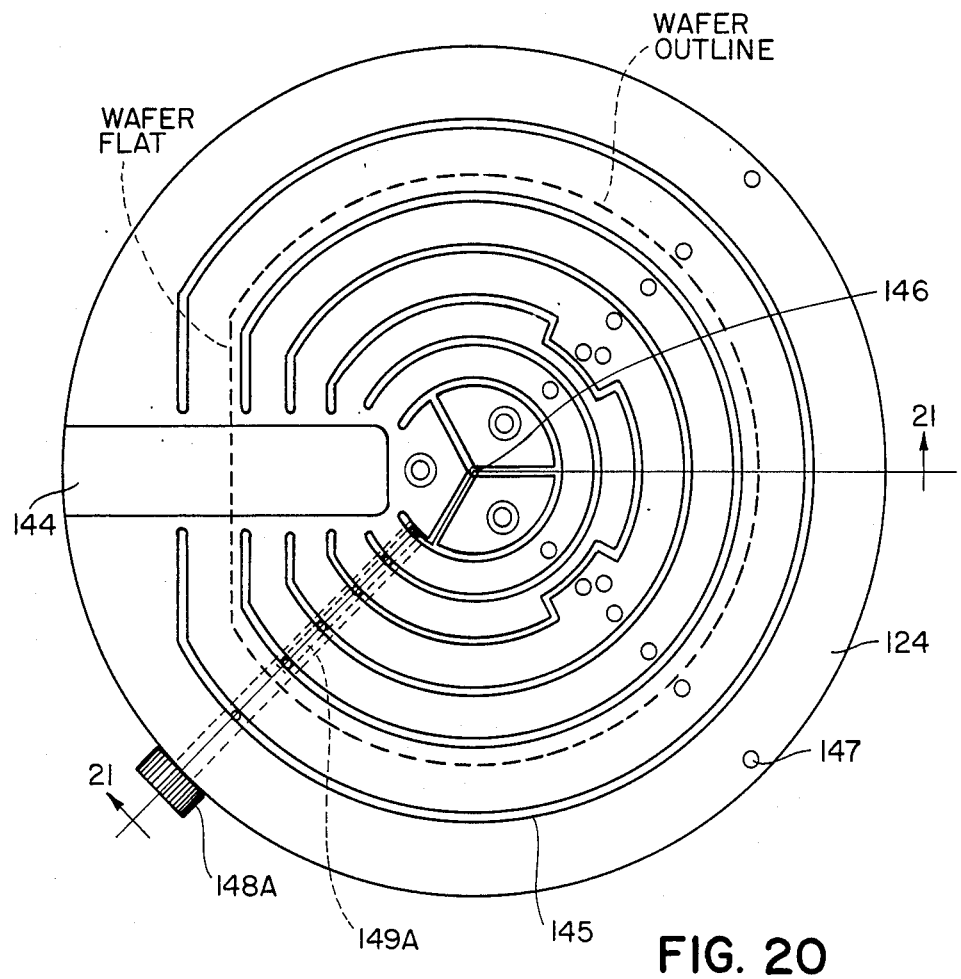
FIG. 20 is a top plan view of the wafer carrying platform of the z, θ stage in accordance with this invention.

Accurate location of this home position of the stage may be important if the system is interfaced to an automatic wafer handling system for loading and unloading wafers from the platform 124. For example, systems are available on the market for automatically inserting a blade into a groove 144 machined in the platform 124 as shown in FIG. 20 and vacuum picking the wafer off the top surface 23 of the platform and carrying it to a wafer cassette. Following this, the next wafer is vacuum picked out of the cassette and positioned on the wafer platform surface 23. The vacuum on the pick is then removed and the vacuum on the z, $\theta$ stage platform 124 is turned on to hold the wafer in position.

The integration of the optical sensors associated with the z, $\theta$ stage into an overall safety inhibit circuit arrangement will be discussed in detail below. It should be apparent that the home position sensing for the rotor 106 could be accomplished by other marker and sensor arrangements, including a microswitch arrangement which might utilize a switch actuator carried on gear 118 and a microswitch mounted on a bracket positioned on the exterior of the housing 105. The optical sensor arrangement 142 with marker 141 is preferred because of the position accuracy achievable with that arrangement. The home position sensor is actualy integrated into a position control function which determines the actual home position of the rotor 106. This is in contrast to the stage up and stage down optical sensors which only report the position of the stage and do not actually control the stage up and stage down position locations.

Figure 21:
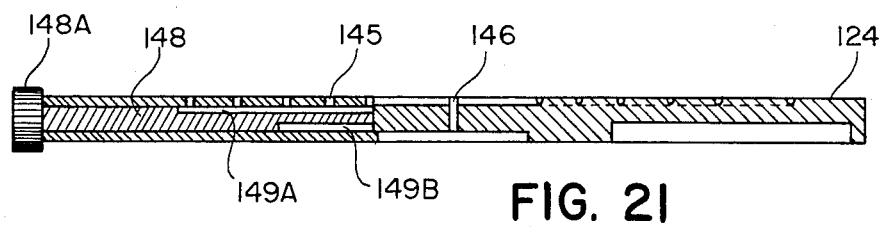
FIG. 21 is a partial section view through the wafer platform and taken along the lines 21—21 in FIG. 20.

Referring now to FIGS. 20 and 21, the structural details of the wafer platform 124 will be considered. On the top surface 23 of the wafer platform 124, an arrangement of generally circular grooves 145 is provided. The flat portion of each of the grooves corresponds with the position of a wafer flat. For example, the outline of a wafer is shown in FIG. 20 and the flat of the wafer is aligned with the flat region of the vacuum grooves 145. Central aperture 146 communicates vacuum to the interconnected groove arrangement. A selective groove coupling arrangement is provided by the slotted key 148 which has a plurality of channels 149A and 149B of different lengths therein so that the position of the key 148 controls how many of the circumferential vacuum grooves 145 are connected to vacuum. This provides an easy way of controlling how many grooves receive vacuum for holding wafers of different diameters on the platform 124. In this manner, the entire bottom surface of the wafer can be held tight to the top of the wafer platform 124. Since wafers are sometimes distorted, holding them flat against the platform provides for more accurate probing since the force of the probe tips against the wafer will be more consistent from point to point if the wafer is not deforming as the probe bottoms on the wafer surface.

An arrangement of threaded apertures 147 is provided in the top surface 23 of wafer platform 124 to receive nylon alignment posts at various radial positions. These alignment posts enable a semiconductor wafer to be accurately positioned on the platform 124 with its center concentric with the center of the platform itself.

Figure 22:
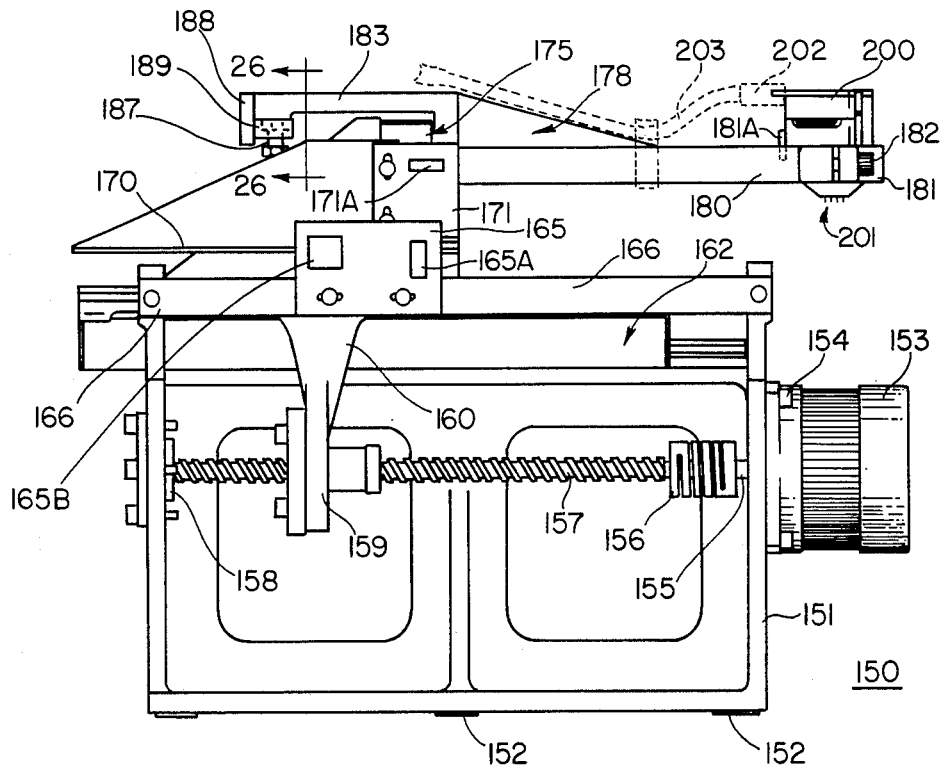
FIG. 22 is a side elevational view of an r, z probe carrying stage in accordance with this invention.

The r, z stage 150 depicted in FIG. 11 is shown in four different views in FIGS. 22 and 25 together with a special view 26 showing the air cylinder drive arrangement for raising and lowering the probe arm to provide the z component of motion of the stage as well as the optical sensor associated with detecting the probe down condition of the stage. It should be understood that the r, z stage 150 could, in some semiconductor wafer test environments, be simply an r stage. It will be apparent from the description below that the z motion component of the r, z stage could readily be eliminated or disabled in situations where the z component is not required or desired for the testing protocol being performed.

The r, z stage 150 includes a base casting 151 which mounts, using bolts through the mounting apertures 152, to the platform 41 as shown in FIG. 11. With appropriate jigging, the base casting 151 can be positioned on the platform 41 so that the center line of the probe arm 180 intersects the central axis of the z, $\theta$ stage 100.

An electric motor 153 is mounted on one end wall of the base casting using mounting screws 154. The shaft 155 of motor 153 is coupled by way of a flexible coupling 156 to a lead screw 157 which extends to the back wall of the casting 151 where it is journaled in a bearing 158. A traveling nut arrangement 159 is carried on lead screw 157 so that the electric motor and lead screw arrangement can drive the coupling arm 160 and carriage platform 161 back and forth in the r direction, i.e., along the radius of the wafer platform 124 at the z, $\theta$ stage. The carriage platform 161 is mounted on a ball slide arrangement 162. The stationary portion 163 of the ball slide 162 is mounted to the base casting 151 and the sliding portion 164 is mounted to the carriage platform 161 to translate therewith.

Figure 23:
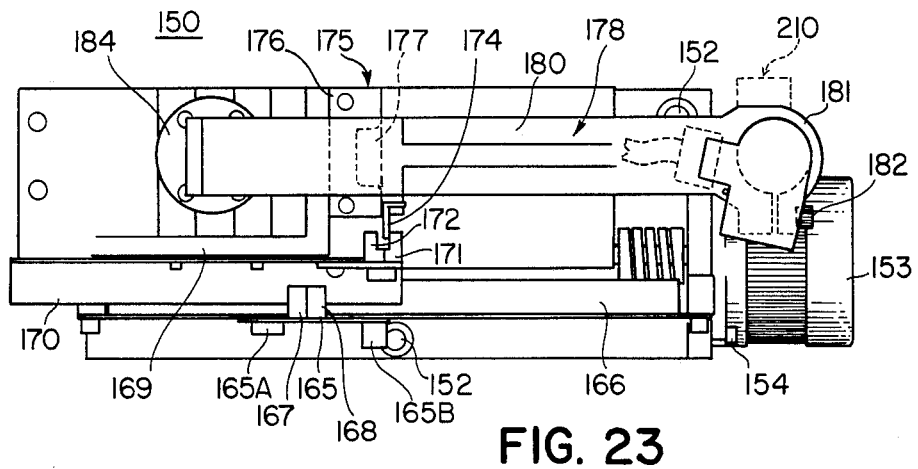
FIG. 23 is a top plan view of an r, z stage in accordance with this invention.

An optical sensor circuit board 165 is mounted in a stationary position on a bracket arrangement 166 which is in turn mounted on the base casting 151. A pair of optical sensors 167 and 168 are mounted to the circuit board 165 and electrical connectors 165A and 165B are provided for power input and signal output. An L-shaped bracket 169 is mounted to the carriage platform 161 and carries thereon a position flag 170 which functions together with the optical sensors 167 and 168 (as best seen in FIG. 23) to signal the position of the carriage platform 161 and bracket 169. More specifically, the flag 170 and the optical sensors 167 and 168 report when the probe arm 178 is in the parked position, or in the home position, or in any intermediate position therebetween.

As shown in FIG. 23, the carriage and attached probe arm 178 are in an intermediate position in both of the optical sensors 167 and 168 are blocked by the flag 170. When the carriage is in its leftmost position, i.e., the parked position, optical sensor 168 is uncovered while optical sensor 167 is covered by the right edge portion of flag 170. The output signal from sensor 168 thus reports the probe parked position of the carriage arrangement. When the carriage and probe arm are in the home position, optical sensor 167 is uncovered while optical sensor 168 is covered by the left hand portion of the flag 170. The output from sensor 167 thus reports the probe home position. The use of these output signals in conjunction with a safety inhibit circuit will be described in detail below. In the probe parked position of the carriage arrangement, the probe arm 180 is in a position such that the probe 200 and the right most edge of the probe arm 178 are parked in a position adjacent to and non-interfering with the lifting of the wafer platform 124 of the z, $\theta$ stage 100.

Probe arm 178 has a front portion 180 mounted in a cantilevered fashion to a vertical support 179 which is carried on the moving portion 177 of a precision bearing slide arrangement 175. The stationary portion 176 of precision bearing slide arrangement 175 is mounted to the L-shaped bracket 169 carried in a stationary fashion on the carriage base 161. A circuit board 171 is mounted to the bracket 169 to travel with the carriage base and the probe arm and has an optical sensor arrangement 172 mounted thereon. A position flag 174 (best seen in FIGS. 23 and 24) is mounted to the vertical support 179 so that the flag 174 rides up and down along with the probe arm arrangement 178 on the moving ball slide portion 177. A notch 174A in the position flag 174 uncovers the optical sensor 172 when probe arrangement 178 is in the probe up position. Thus, the output of optical sensor 172 reports the probe up position to the control system and the safety inhibit system which will be discussed below.

A second cantilevered arm 183 on the probe arm assembly 178 extends back over the slide arrangement 175 to cooperate with an air cylinder 184 for raising and lowering the probe arm assembly 178. As shown in FIGS. 25 and 26, air cylinder 184 is mounted to the carriage base 161 and has upper and lower air input couplings 185 and 186 which are controllably supplied with air pressure to raise and lower the piston 187. Piston 187 in turn raises and lowers the probe arm assembly.

Circuit board 188 is mounted on the back of the cantilevered arm 183 and, in turn, has optical sensor arrangement 189 (best shown in FIG. 26) mounted thereon for signaling the probe down condition. The optical sensor 189 is blocked or OFF as long as the piston 187 of the air cylinder 184 is in contact with the cantilevered arm 183. When the piston 187 drops away from the cantilevered arm 183, the probe tips 201 shown in FIG. 22 are in contact with the wafer surface and the optical sensor 189 sends an output signaling the probe down condition. In actuality, the probe status condition is signaled by the combination of optical sensor 172 being OFF and optical sensor 189 being ON. Conversely, the probe up condition is signaled by optical sensor 172 being ON and optical sensor 189 being OFF. Since the probe up condition will only be signaled when optical sensor 172 is ON, a failure of optical sensor 172 which keeps it in an OFF condition will provide a fail safe indication since the control and inhibit system wll assume that the probe is either down or in an intermediate position. The sole purpose of optical sensor 189 is to report that the probe is down to signal the overall control system to start the measurement cycle. If optical sensor 189 fails, the probe down will never be reported and a system time out will show that a malfunction has occurred.

FIGS. 22-24 show a four-point resistivity test probe 200 mounted in a mounting aperture at the far right end 181 of the probe arm 180. The probe 200 is mounted in a canted position utilizing a positioning pin 181A for reasons which are discussed in the above-identified co-pending and commonly assigned patent application. Clamping screw 182 holds the probe 200 in position. A connector 202 along with cable 203 provides electrical connections to test probe 200. It should be understood that other forms of test probes could be mounted on the probe arm assembly 178 utilizing mounting arrangements which are appropriate to the particular probe.

Figure 32:
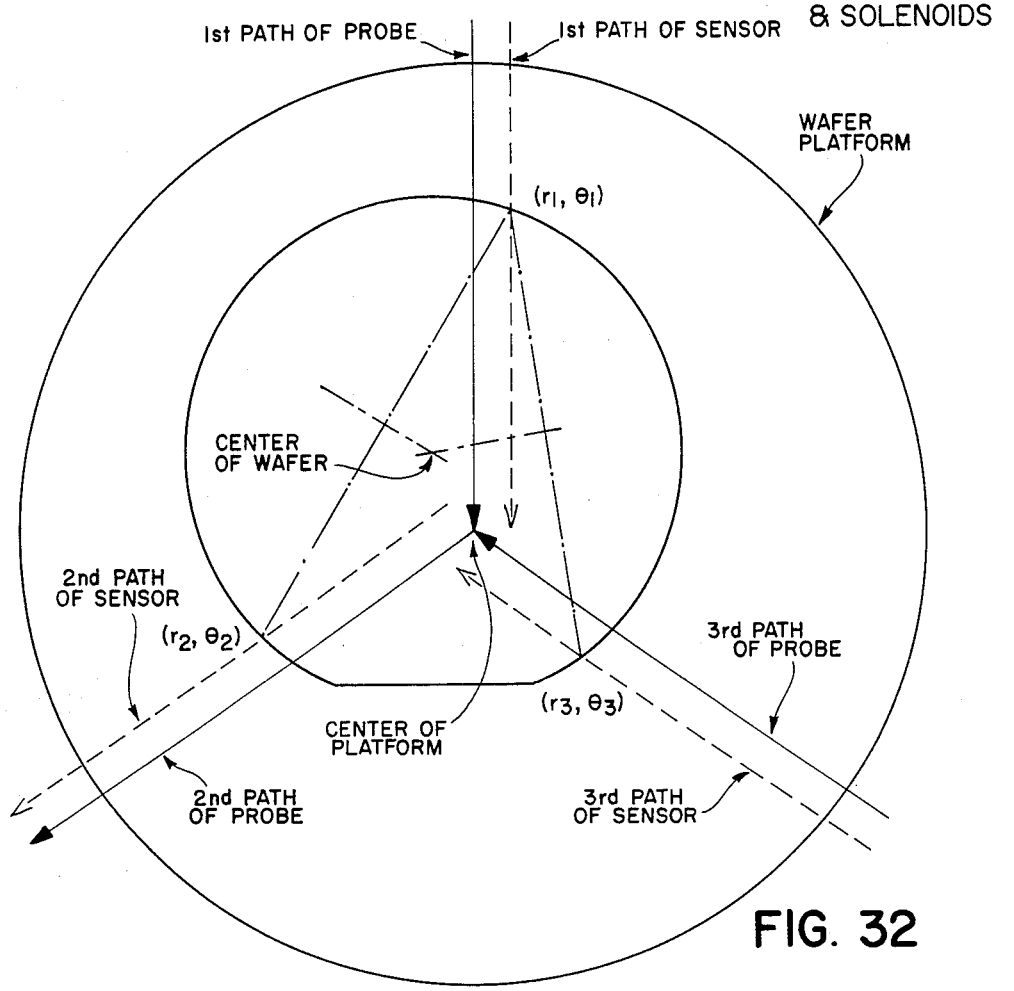
FIG. 32 is a schematic illustrating the wafer position and size determining feature of this invention.

FIG. 23 shows an optional reflection type optical sensor 210 positioned on the probe arm assembly 178. This optional sensor arrangement preferably would include a light piping arrangement for shining a collimated beam of light down onto the platform of the z, $\theta$ stage and receiving light back to a light detector so that the edge surface of a wafer may be detected. This sensor arrangement 210, together with appropriate software control of the z, $\theta$ and r, z stage movements, can be utilized to determine the position of the center of the wafer on the wafer platform 124 and also the wafer size, utilizing a procedure described in detail below in conjunction with the explanatory diagram of FIG. 32 and the software flow chart of FIG. 41.

FIGS. 27, 28 and 28A depict an optional protective traveling shroud 211 mounted in the light tight enclosure formed underneath the top cover 13 of the tester cabinet. The traveling shroud 211 basically comprises a box-shaped sheet metal enclosure having a top surface 215 in which a circular opening slightly smaller than the outer diameter of the wafer platform 23 is formed. The traveling shroud 211 is arranged to rest on the bottom floor 20 of the light tight enclosure when the wafer platform 23 is in the stage down position. As shown in FIG. 28A, an arrangement of four corner guide pins 214 and channels 213 provide positive guidance for the traveling shroud 211 in its upward travel.

As the wafer platform 23 moves up, the outer circumferential edge contacts the marginal edge of the circular hole in the top 215 of the traveling shroud so that the shroud 211 will move upward with the wafer platform 23. The lip 212 on the bottom of the shroud has overall dimensions greater than the door opening in the top 13 of the cabinet so that shroud 211 cannot be removed from the cabinet without raising the top 213. A rectangular cut-out 217 in the back wall of the shroud cooperates with the opening in the back wall 22 of the light tight enclosure to admit the probe head into the enclosure when the wafer platform 23 is in the stage down position. A U-shaped plastic piece 216 is glued to the edge of the shroud aperture to eliminate any sharp metal cutting edge at that point and to deaden the sound of the top of the wafer platform 23 striking the edge of the top 215 of the shroud.

Figure 29:
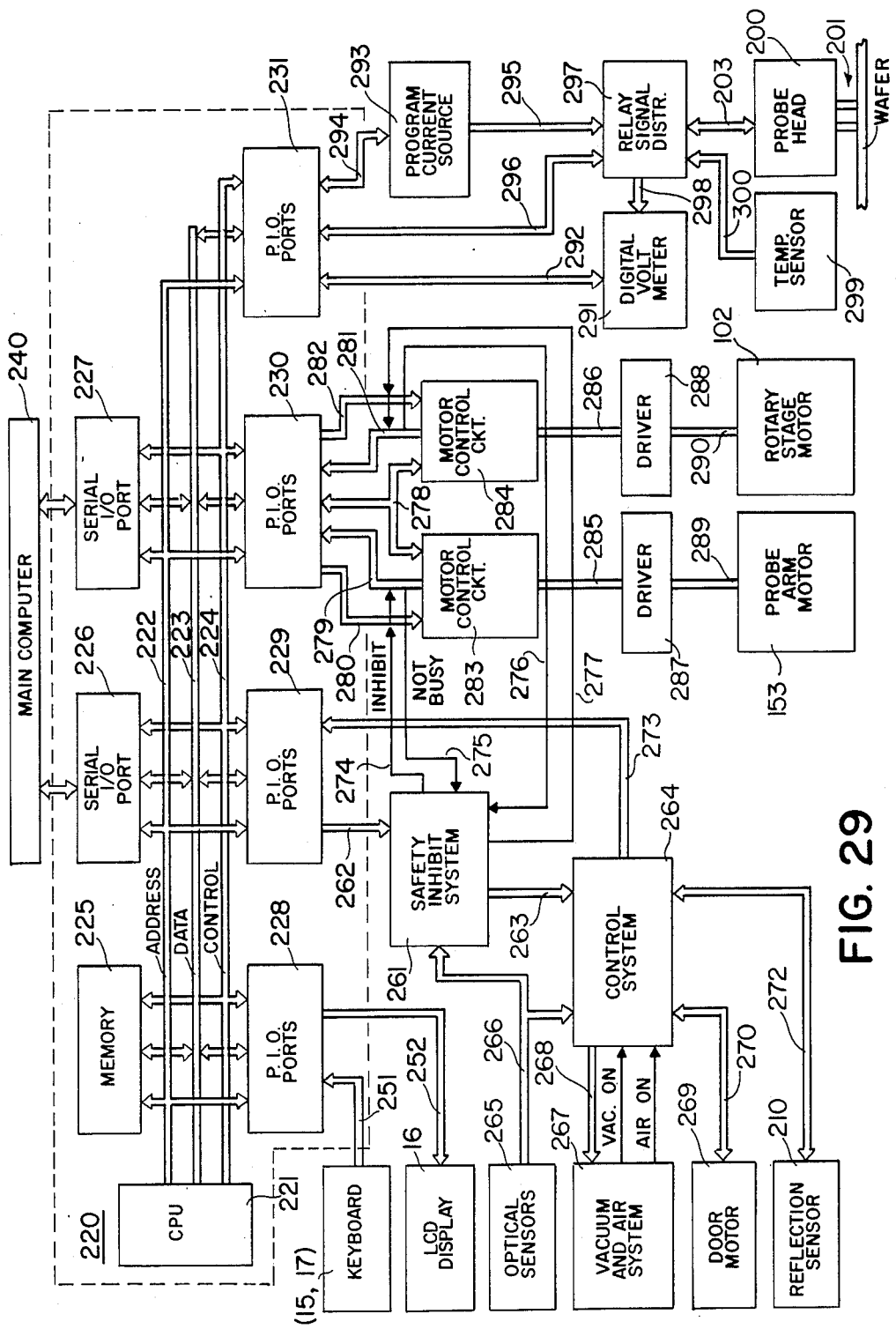
FIG. 29 is a system block diagram for a computer controlled automated resistivity test system in accordance with this system.

The automated resistivity tester which forms the preferred embodiment of this invention incorporates not only the z, $\theta$ stage 100 and the r, z stage 150, but also a sophisticated real time control and data acquisition subsystem based on microcomputer technology. A block diagram of this overall computer-based control and data acquisition system is depicted in FIG. 29. Components within rectangle 220 comprises a standard microcomputer system in which a central processing unit (CPU) 221 communicates by address, data and control buses 222, 223 and 224, respectively, with program and data storage memory 225, serial I/O ports 226 and 227 and programmable I/O ports 228, 229, 230 and 231. This is a standard microcomputer architecture and the details of the operation of this portion of the system are very well-known and need not be described in detail here.

The serial I/O ports 226 and 227 communicate with a main or host computer 240. In one embodiment of the automated resistivity tester system, the main computer 240 is the master computer and the operation of the microcomputer system 220 is slaved to that computer. In other words, the commands for the automated resistivity tester in a control and data collection mode are downloaded from the main computer 240. A more limited, automated resistivity tester can be implemented on a stand alone basis utilizing microcomputer 220 programmed by way of an operating program in memory section 225 to perform limited resistivity tester functions. In that embodiment, a printer interface for directly printing out the data collected would be provided, but the system would not include features of data base collection, storage and management. In a more sophisticated system, the main computer 240 is hooked up to a graphics printer and to a CRT terminal for displaying the results of the resistivity testing on a particular wafer in the form of a contour map and/or diameter scan. The main computer 240 will also include a mass data storage device.

P.I.O port 228 serves the keyboard input and LCD display output functions. Keyboards 15 and 17 communicate via bus 251 to input manual control signals into computer system 220. Computer system 220 communicates data, status and other information to LCD display 16 via output signal bus 252.

P.I.O ports 229 and 230 provide output control and input data gathering functions for the operation of the z, θ stage and the r, z stage as well as the door 19 and the reflection sensor 210. P.I.O. port 230 is dedicated to the motor control and position reading functions of motor control circuit 283 associated with the probe arm motor and motor control circuit 284 associated with the rotary stage motor. The probe arm motor controls the r position of the probe in the r, z stage and the rotary stage motor 102 controls the θ position of the wafer platform in the z, θ stage. Data is provided on the target motor position to each of the motor control circuits 283 and 284 via data bus 278. Separate status signal lines 279 and 281 feed back motor control status information to P.I.O. port 230 and separate control buses 280 and 282 feed separate control signal information to motor control circuits 283 and 284. Status signal bus 279 includes a NOT BUSY status lead 279 which is coupled into safety inhibit system 261. Similarly, status bus 281 from motor control circuit 284 includes a NOT BUSY signal lead 276 which is coupled to the safety inhibit system 261. Safety inhibit system 261 provides INHIBIT signals via lines 274 and 277 to the control signal buses 280 and 282, respectively.

The outputs 285 and 286 from motor control circuits 283 and 284 feed separate driver circuit 287 and 288. The outputs of the separate driver circuits function over analog signal buses 289 and 290 to drive the probe arm motor 153 and rotary stage motor 102. It should be noted that the motor control circuit 283 can not drive the probe arm motor when an inhibit signal is received from the safety inhibit system 61 and the motor control circuit 284 can not drive the rotary stage motor when an inhibit signal is received on lead 277 from safety inhibit system 261. In this manner, the safety inhibit system provides a safety interlock which precludes operation of the respective motors under status conditions which would cause damage to some other component of the system.

The safety inhibit system 261 is interposed between the P.I.O. port 229 and control system 264 so that control system 264 cannot receive direct command signals on the bus 262 from the P.I.O. port 229, except those commands which do not involve a potential safety hazard. Safety inhibit system 261 receives inputs via bus 266 from optical sensors 265. The same outputs of the optical sensors are input to the control system and can be read by the microcomputer 220 over the input lines 273. The control system 264 provides controlling signals received from the safety inhibit 263 to the vacuum and air system 267 and to the door motor 269. Control signal 264 also communicates in a two-way fashion with the reflection sensor over a bus 272. Vacuum and air system 267 supply VACUUM ON and AIR ON signals to the control system 264 and these signals can also be read by the microcomputer 220 over the input signal line 273 to P.I.O. ports 229.

Control of the circuitry which performs a measurement on the wafer is accomplished by computer 220 through P.I.O. ports 231. A programmable current source 293 receives control command information on a signal bus 294 and provides programmed levels of current on signal lines 295 through a relay signal distributor 297 and signal bus 203 to the probe head 200. Signal bus 203 takes analog signals back from the probe head through the relay signal distribution network 297 into the digital volt meter 291 via bus 298. Digital volt meter 291 communicates via bus 292 with P.I.O ports 231 for feeding digital voltage readings to computer 220 and for receiving range information and the like from the computer. A temperature probe 299 is provided adjacent the wafer platform and communicates through the relay distribution network 297 to the computer. Control signals are provided and information is fed back from the relay signal distributor over a bus 296 to the P.I.O. ports 231.

Figure 30:
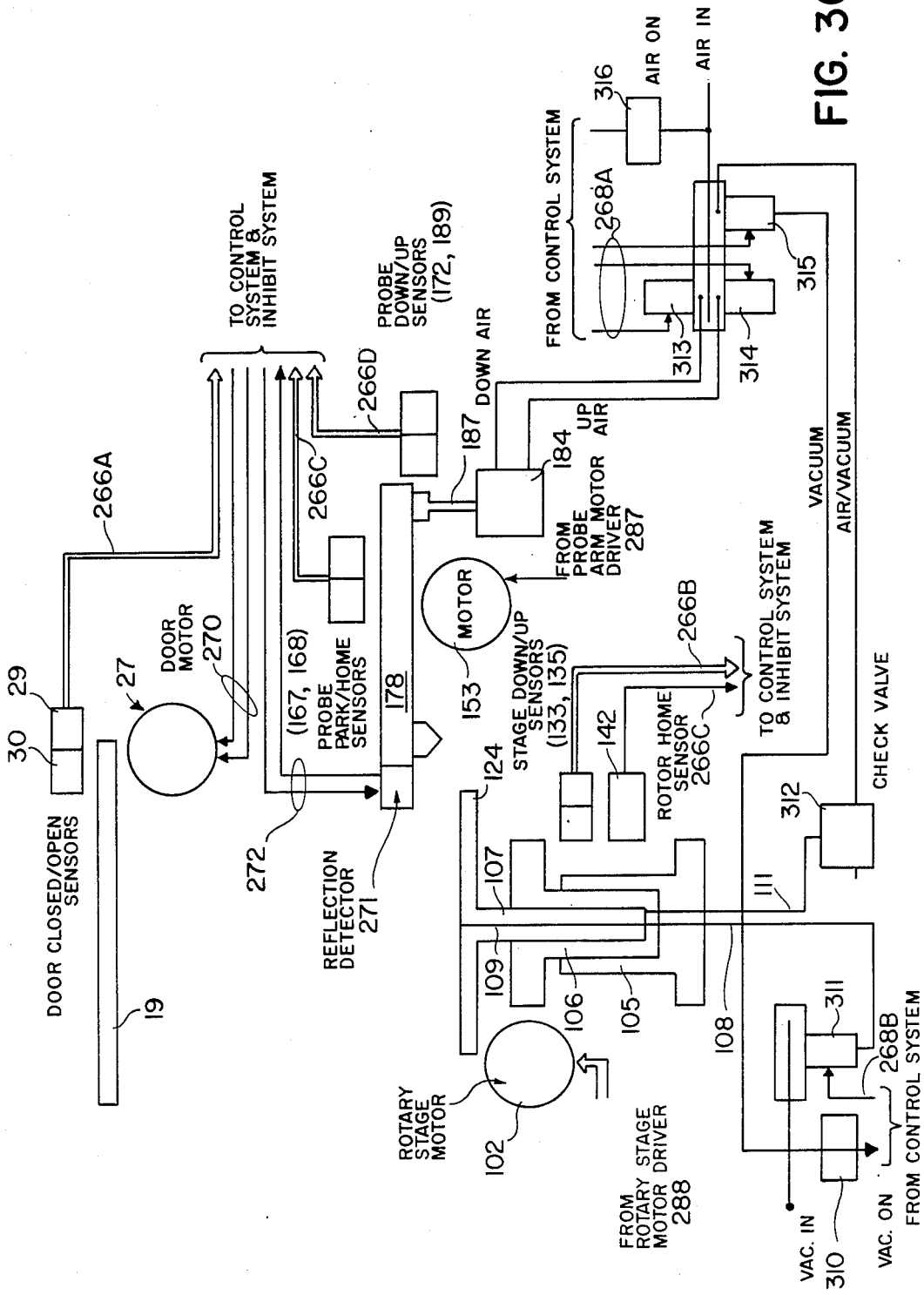
FIG. 30 is a schematic diagram of the motor, position sensor, and air and vacuum system in accordance with this invention.

FIG. 30 shows schematically the specific interfaces from the control system 264 to the vacuum and air system 267, the door motor arrangement 269 and the optical sensors 265. These overall arrangements have mostly been described above in terms of their structure and function. The only portion of the schematic circuitry shown in FIG. 30 that has not been previously described is the vacuum/air system.

It will be remembered that the principal function of the vacuum portion of the vacuum/air system 267 is to provide vacuum to the interior of the piston 107 through a tube 109 which communicates vacuum to the vacuum grooves in the top surface 23 of the wafer platform 124. A source of vacuum is present on the VAC. IN line and is coupled through hoses through a VAC. ON switch 310 which sends a signal to the control system which can be read by the computer that the source of vacuum is available. A control signal from the control system over line 268B operates a solenoid 311 to couple the vacuum to line 108 which supplies it to the vacuum grooves on the wafer platform 124. This involves an on/off solenoid function which opens and closes a valve arrangement to control whether vacuum is present or not on the wafer platform.

The air control system is somewhat more complex in that air pressure is utilized to drive the z, θ stage from a stage down to a stage up position and also to drive an air cylinder controlling the probe up and probe down functions. A control signal into solenoid 315 from the control system 264 operates that solenoid to connect air from the AIR IN port to the air/vacuum line and through a check valve 312 to the line 111 into the interior of the rotor 106 under the piston 107. This causes piston 107 to rise from a stage down to stage up position. When the control signal to solenoid 315 is a stage down signal, vacuum is coupled to the air/vacuum line into the check valve 312 which vents the air pressure in line 111 to the atmosphere and allows piston 107 to drop under influence of gravity.

Control signals into solenoids 313 and 314, respectively, control the supply of air to the UP AIR and DOWN AIR lines into the air cylinder 184. When solenoid 314 is operated to supply air to the UP AIR line, the cylinder 184 moves the probe up. Similarly, when air is supplied to the DOWN AIR line by operation of solenoid 313, the piston 187 is forced downward.

Figure 31:
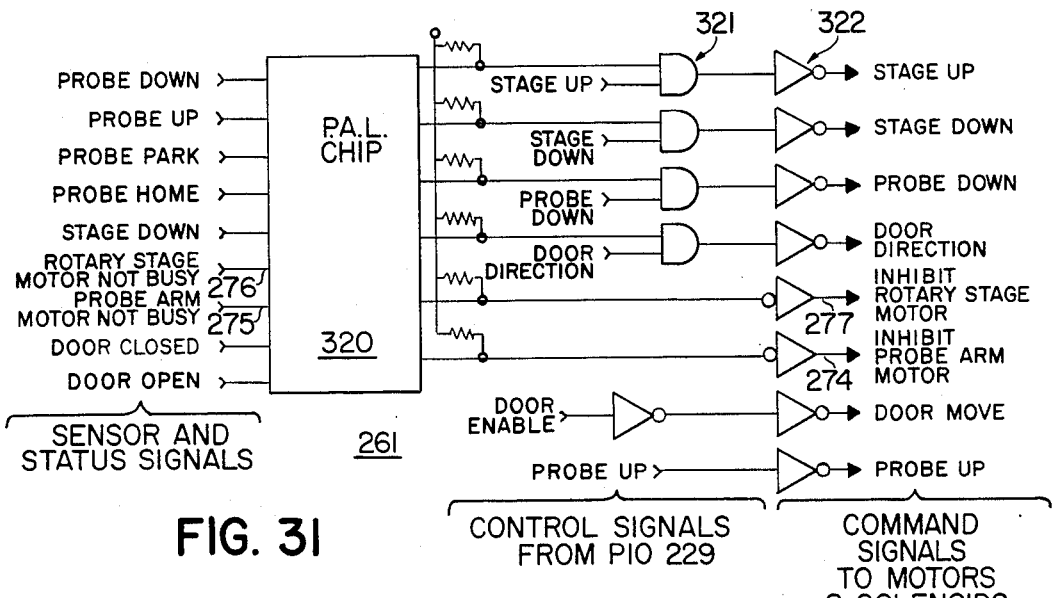
FIG. 31 is a schematic circuit diagram of a safety inhibit system in accordance with this invention.

The overall schematic circuitry of FIG. 30 will be utilized in conjunction with the inhibit system circuitry shown in FIG. 31 and the software flow charts shown in FIGS. 34-41 to illustrate the overall function of the system in a standard sequence of steps utilized to make a measurement on the wafer.

The safety inhibit system circuitry 261 shown in FIG. 31 incorporates a programmed array logic (PAL) chip 320 which receives a plurality of sensor signal inputs and status signal inputs from the motor control circuits 283 and 284 and provides a plurality of enable and/or disable (inhibit) output signals which are logical combinations of the sensor and status signal inputs. Four of the control signals from P.I.O. 229, namely, stage up, stage down, probe down and door direction signals, are individually fed to a series of AND gates 321 followed by inverter amplifiers 322 to provide stage up, stage down, probe down and door direction command signals provided that the outputs of the AND gates 321 are enabled by coincident enabling signals on the other inputs. In addition, the PAL chip 320 provides inhibit outputs for the rotary stage motor and the probe arm motor under certain logical combinations of the sensor and status signals input to the PAL chip. Since the door motor requires both a door direction and a door enable command before the door motor operates, only one of these control signals is coupled through an AND gate. The probe up command is always a safe command in that there is never any danger in raising the probe since that action will never interfere with any other functional activity or cause a dangerous or damaging positional conflict between various components of the system.

It can thus be seen that the PAL chip is an arbitrator of the propriety of processing a particular control signal depending on the position or movement status of the components of the system. For example, if the computer system 220 issued a STAGE UP command, and the probe 200 is not in a probe parked position, the STAGE UP command should be disabled unless and until the probe is moved to the probe parked position. Similarly, a stage up command conflicts with a door closed condition. Accordingly, the PAL chip is programmed to disable the input to the AND gate servicing the STAGE UP control signal if the probe parked sensor is not ON or the door open sensor is not ON. Both of those sensors must have a true or ON output before the STAGE UP command can be processed. Essentially, the same condition is true of a stage down control signal. It should not be processed unless the probe is in the parked position and the door is open.

Consider now the PROBE DOWN command. This command should not be processed if either the wafer platform is not down or the stage motor is busy or the probe motor is busy. Most importantly, the probe should not be dropped onto a wafer on the platform is either of the motors is busy moving the wafer platform to a new location. The door direction control signal should not be passed to the door direction motor if, for example, the stage down status signal is not present.

The PAL chip will produce inhibit signals for both the rotary stage motor and the probe arm motor anytime the probe down sensor is ON since the platform should not move when the probe is down on the wafer.

Additional, more complicated safety inhibit system functions could also be implemented in a system which utilizes the reflection detector 271 to map the position of the wafer on the wafer platform. For example, if a system has detected the center of the semiconductor wafer relative to the center of the platform and has calculated the radius of the wafer and determined the position of the wafer flat, the permitted $r, \theta$ coordinates at which the probe head should be dropped could be mapped in memory and a separate arrangement could be provided for processing of the PROBE DOWN signal which would not place the probe in contact with the area of the wafer.

From the above discussion, the logical equations which are necessarily embodied in the PAL chip are readily ascertainable and the person of skill in the art can program the appropriate logic equations to achieve the enable/disable and inhibit logic required by the system.

Figure 33:
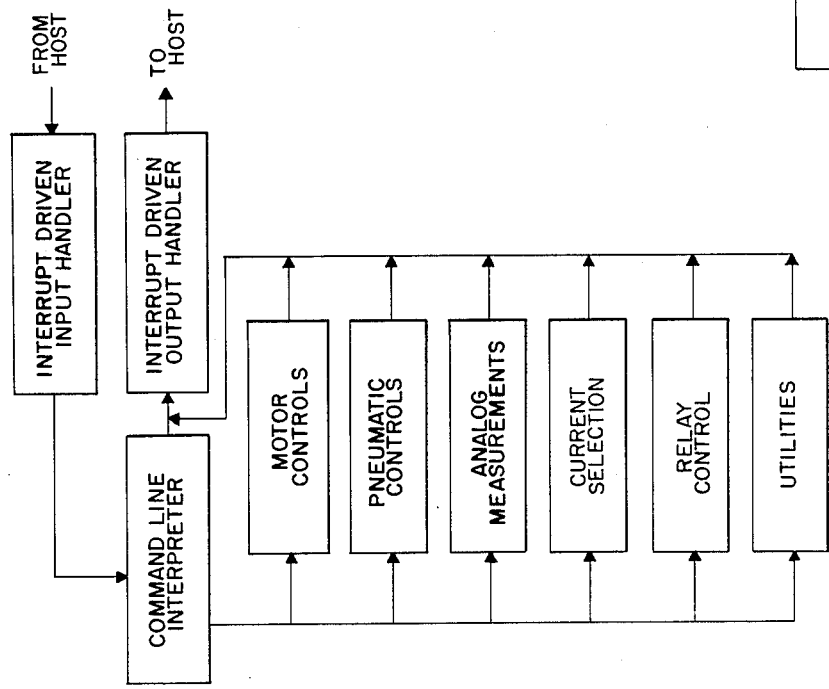
FIG. 33 illustrates the software control architecture of an automated resistivity test system in accordance with this invention.

FIG. 33 shows the overall software control architecture of the automated resistivity test system depicted in schematic block diagram form in FIG. 29. Two-way communications from the host computer 240 are handled by way of interrupt input handlers and interrupt output handlers. The host computer issues a command to the microcomputer system 220 which is fed to a command line interpreter which either validates or invalidates the command. If the command is a valid one, it is acknowledged to the host and interpreted by the computer system 220 to issue appropriate signals to P.I.O. ports, etc., to provide control and/or data signals to one or more of the modules of the system which essentially function in parallel. These modules are the motor controls, the pneumatic (vacuum/air) controls, analog measurement circuitry, the current selection circuitry (programmable current source 293), the relay control circuitry 297 and certain program utilities which may involve program macros containing a sequence of comamnds and/or subroutines which may involve either operational or diagnostic purposes.

The architecture of the system is such that any of the individual functions which the system is capable of performing can be individually commanded from the host computer. In normal operation the host computer issues all of the sequence of functional commands to perform an overall multisite data collection operation of the system.

Figure 34:
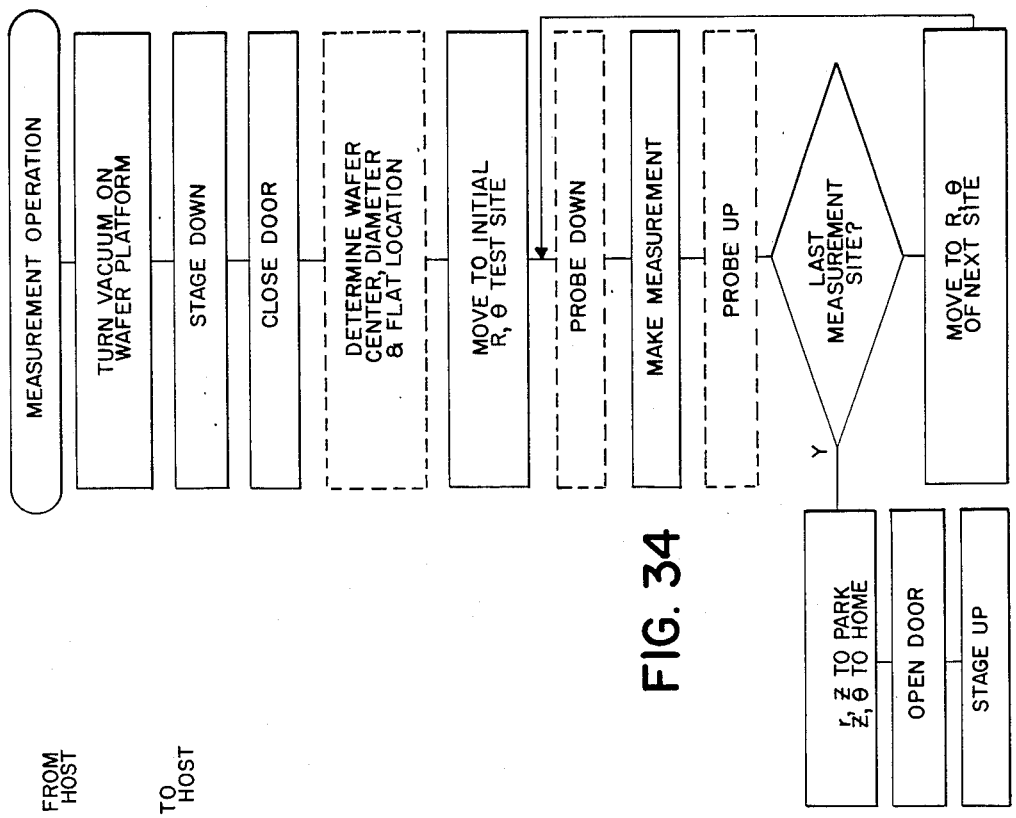
FIGS. 34–41 are software flow charts depicting computer controlled operation of an automated resistivity test system in accordance with this invention.

FIG. 34 illustrates a standard sequence of command functions which may be downloaded in series from the host computer to perform a typical data collection function. The entry point of the program assumes that the door 19 is open, the $r, \theta$ stage is in the wafer load (stage up) position and the system is ready for placing a wafer on the platform 23. It furthermore assumes that a start measurement command has been received. The first step carried out is to turn the vacuum on to the platform to hold the wafer in position. Next, the stage down command is issued to lower the wafer platform to the wafer test position. The next command is to close the door 19. Each of these three commands involves the execution of an individual program routine which will be described below.

The next step is optional and involves determining the wafer size, center and flat locations. Following this, the computer commands the z, $\theta$ stage and the r, z stage to move the test probe to the r, $\theta$ position coordinates where the first measurement is to be performed. If the type of measurement involves contact of the probe with the wafer itself, the next step is to lower the probe with a probe down routine. Following this, the routine which actually performs the measurement on the wafer is executed followed by a lifting of the probe (if the measurement requires probe to wafer contact).

Next the computer tests whether the site probed is the last site to be probed. If the answer to that test is NO, a routine is executed to move the probe to the next site and the program loops back to the PROBE DOWN box or to the MAKE MEASUREMENT box depending on whether the probe requires contact with the wafer. This loop is continually re-executed until the LAST SITE test produces a yes condition. At this point, a routine is executed to move the probe to the parked position and the z, $\theta$ stage to the home position which defines the "load" condition for the two stages. The next routine is to open the door followed by a STAGE UP routine. The program then exits to whatever additional programming has to be run for data collection, printing, data manipulation, display, etc.

Figure 35:
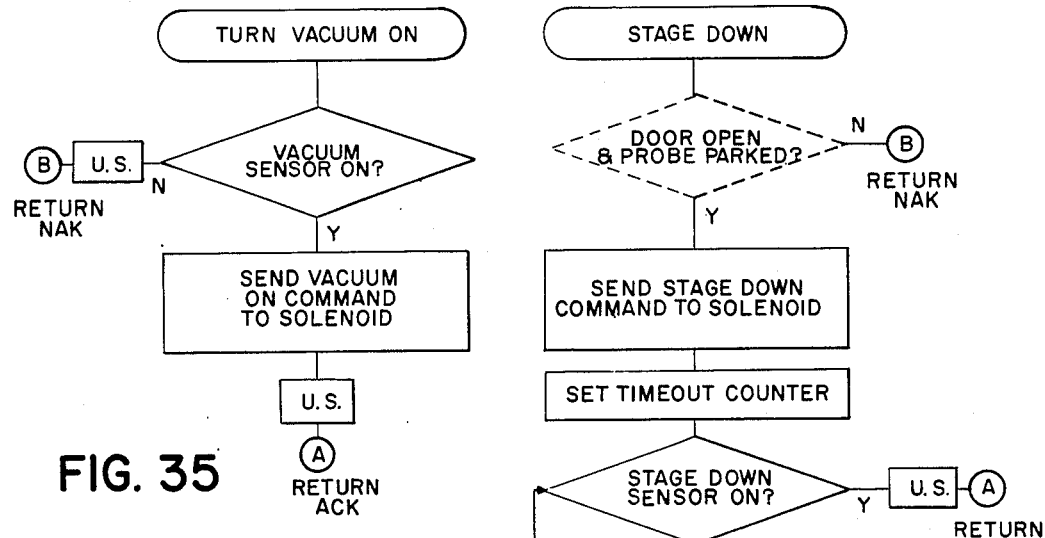

FIG. 35 illustrates the program routine for turning on the vacuum to the wafer platform. The first step is to test whether the vacuum sensor is ON, i.e., whether a VAC. ON output signal is received from the sensor 310. If the test returns a NO condition (indicating "no vacuum"), the system updates the status flag and returns a not acknowledge ("NAK") to the host computer indicating that the command could not be processed successfully. If the test is positive, the system then sends a VACUUM ON command signal to solenoid 311 followed by updating the status bits to show that the vacuum in on to the wafer stage. Thereafter, the system returns an acknowledgment ("ACK") of successful execution to the host computer.

Figure 36:
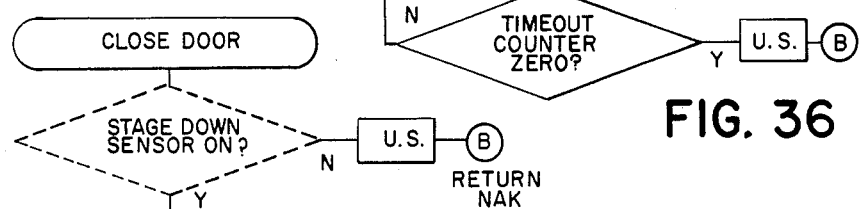
Figure 37:
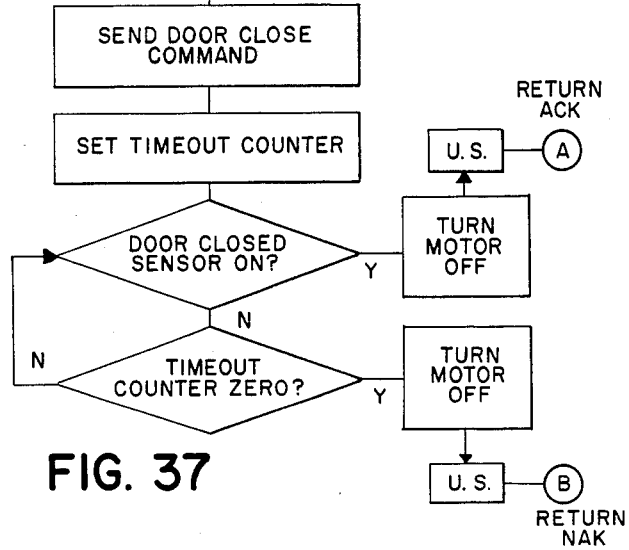

The next step in the process is to perform a STAGE DOWN routine, the details of which are shown in FIG. 36. The first step that the computer may perform would be the dual test to see whether the door open sensor is ON and the probe park sensor is ON. If either of these conditions is not present, then a return not acknowledge is executed. With the safety inhibit circuitry in place, this first step is not absolutely necessary and the computer could send the STAGE DOWN command to the safety inhibit system and the PAL chip 320 (shown in FIG. 31) will either pass that command signal on to the control system or not, depending on the status of the door open sensor and the probe park sensor. It is preferable for the computer to read the status of the sensors first to avoid awaiting for a time out condition if the command could be disabled by the safety inhibit circuitry.

The system next sets a time out counter to determine the amount of time that the system will await completion of the stage down function. The system then tests the output of the stage down sensor to determine whether it is ON. If the stage down sensor is not ON, the system next looks to see if the time out counter has zeroed. Assuming it has not, the system loops through the stage down sensor on test and the time out counter zeroed test until one or the other of those tests results in a YES. If the stage down sensor comes on before the time out counter zeroes, the status flag showing the stage down in updated and return acknowledged is given to the host computer. If instead a time out occurs, an error status is updated and a return not acknowledge (NAK) is provided to the host computer. It should be understood that anytime a return not acknowledged is provided, the overall execution of the multistep program to perform a measurement is interrupted and the measurement can not be performed unless and until some remedial action is taken to fix whatever problem is precluding satisfactory execution of the program.

The next routine to be executed is the close door routine. The first step of that routine is to test whether the stage down sensor is ON. If that test returns a no condition, the status is updated and return not acknowledged is performed. Next, the time out counter is set and the system alternately checks for the ON condition of the door sensor or time out of the timer. Whichever of these test returns a YES first will result in an updating of status and turning off the door motor. If the door closed sensor ON test first returns the YES condition, a return acknowledge will be sent. If the system first times out, a return not acknowledge will be sent.

Figure 38:
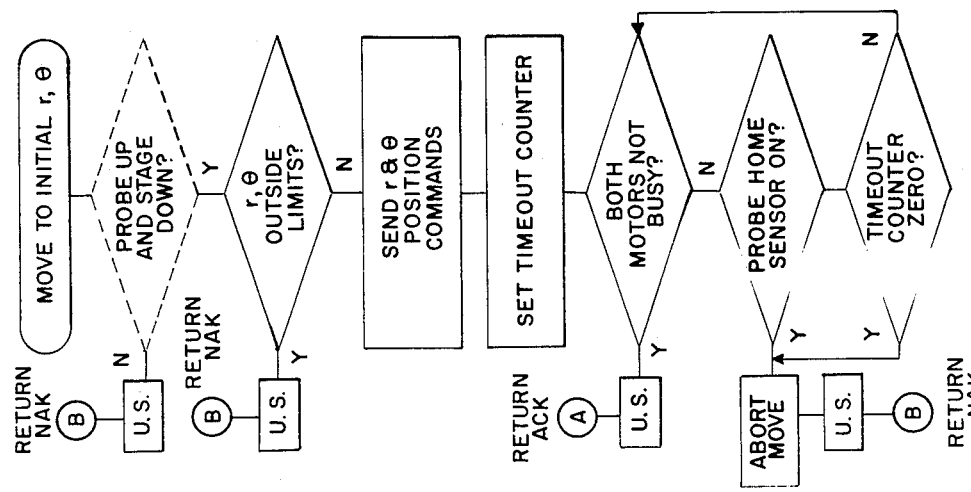

The next step in the sequence is shown in FIG. 38 and involves moving to an initial r, 0 position. The first step in this routine is to check whether the probe is up and the stage is down. The next test is whether the r, $\theta$ coordinates to which the probe head is commanded are out of limits for the particular wafer size. If that test is NO, the system sends move commands to the motor controllers providing the final position coordinates to which the z, $\theta$ stage and the r, z stage should be sent, i.e., the final r and $\theta$ coordinates. The next step is to set a time out counter and then enter a loop of tests checking for the completion of moving of the rotary stage motor and probe arm motor, checking to see whether the r stage reaches the home position while the motor is still moving, and testing whether the time out of the timer has occurred. In normal execution, the motor done moving test will be satisfied first and the status updated and a return acknowledged will be provided. If either of the other tests results in YES condition first, the move will be aborted, a status flag updated and a return not acknowledge provided.

Figure 40:
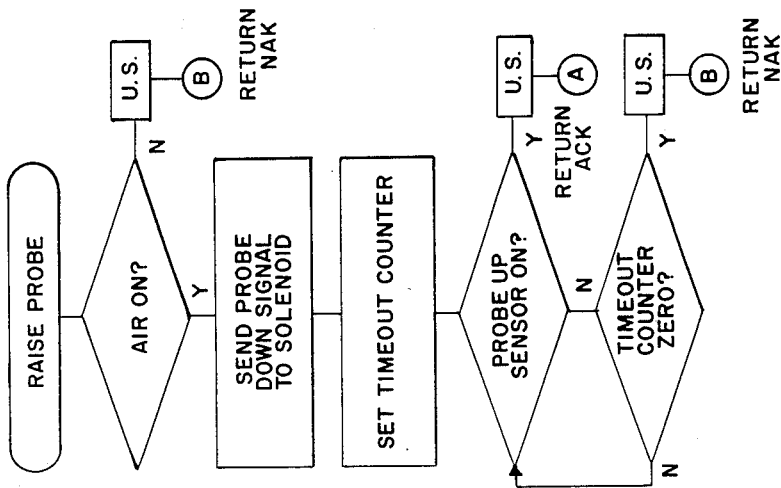
Figure 39:
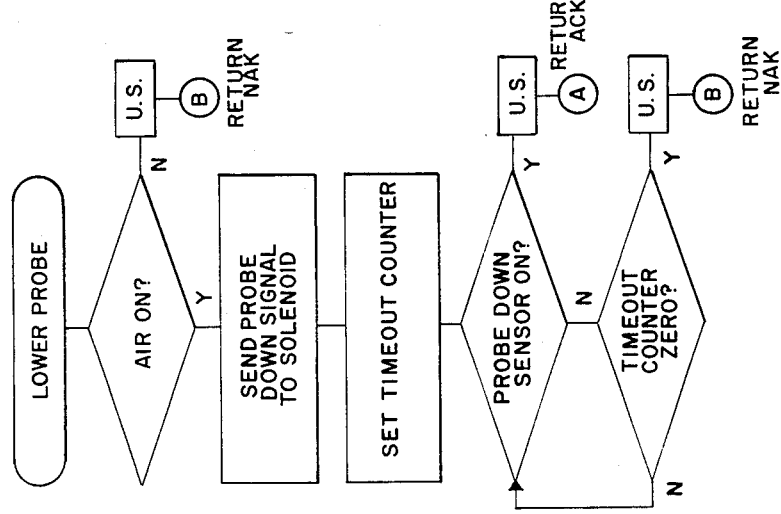

FIGS. 39 and 40 illustrate the routines for lowering the probe and raising the probe. Each of these routines is straightforward and need not be described here.

Figure 41B:
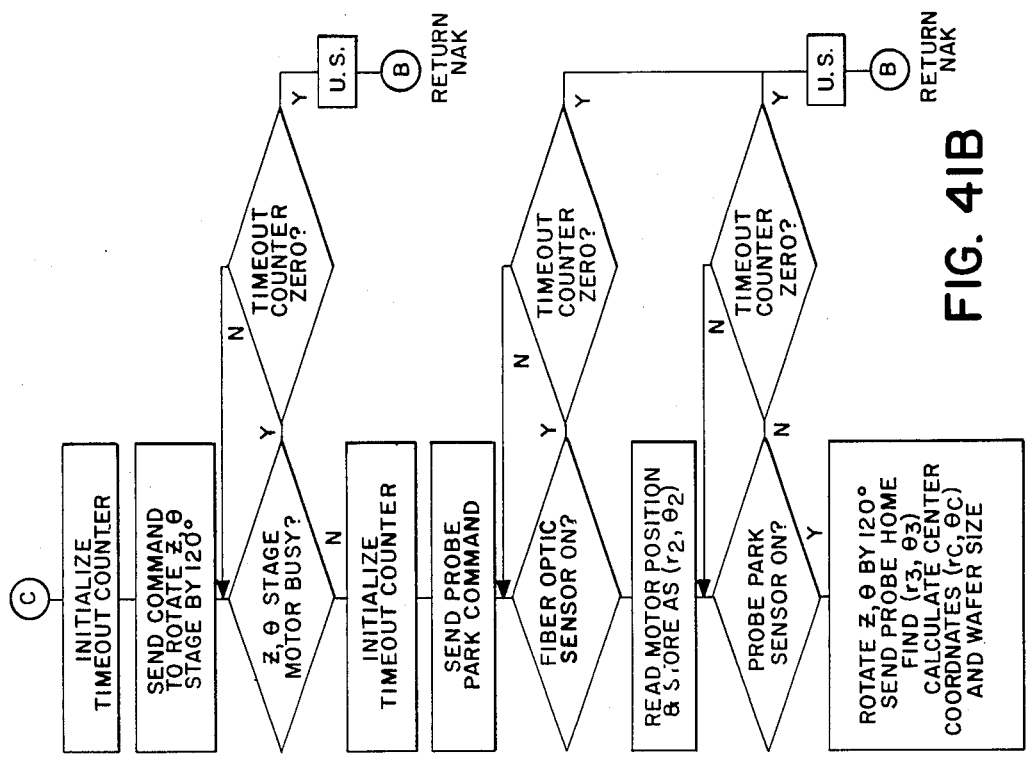
Figure 41A:
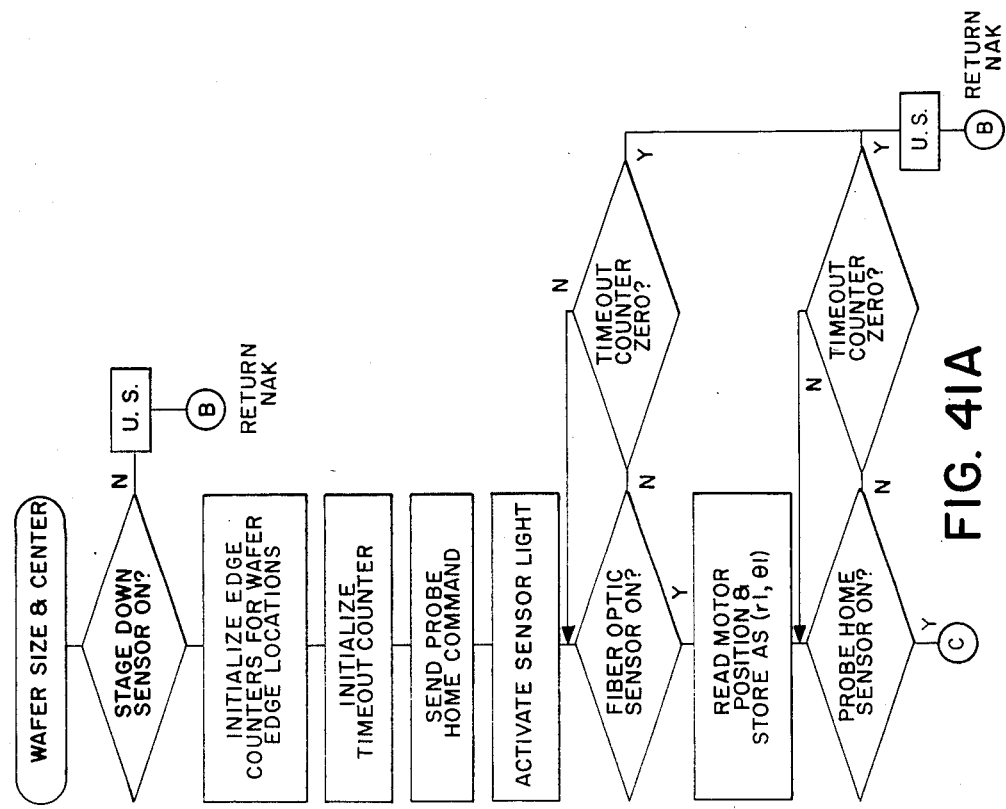

FIG. 41 illustrates the routine for determine the wafer size and center coordinates of the wafer relative to the wafer platform on which it rests. The first thing that this routine does is to check whether the stage is down. Assuming it is, the edge counters for the wafer edge locations are initialized, followed by a step of initializing the r, z stage time out counter. The system then issues a command to the r, z stage to move the prove arm to the home position, i.e., the center of the wafer platform. The probe will thus begin moving along the first probe path shown in FIG. 32, accompanied by the reflective sensor moving on a first sensor path shown in FIG. 32. The system then activates the sensor light source and goes into a loop to sample the output of the fiber optic detector to determine whether the reflection sensor is ON or the r, z stage time out has occurred. This loop continues to run until the reflection sensor turns ON, at which point the system reads and stores the motor position of the probe arm motor and the rotary stage motor as the r, $\theta$ coordinates of the first edge. Since the displacement of the reflection sensor relative to the probe head is known, the actual coordinates to be recorded are the displaced r1, $\theta$1 coordinates of the sensor itself. These can readily be calculated from the motor position information received back from the motor controller for the r, z stage and the z, $\theta$ stage.

The system then looks to determine whether the r, z stage has reached the home position or a time out has occurred on the r, z stage. Any r stage time out will cause a status update and a return not acknowledged condition. Assuming the r, z stage reaches the home position, the next step is to initialize the time out counter again and to issue a command to rotate the z, $\theta$ stage by 120°. The program then enters a loop to determine whether the z, $\theta$ stage has finished moving by looking at the status of the rotary stage motor NOT BUSY signal fed back from the motor controller circuit 284 shown in FIG. 29. Once it has been detected that the z, $\theta$ stage has stopped moving, the time out counter is again initiated and a command to the motor control circuit 283 to drive the probe arm toward the probe park position. The system then enters the same loop of sampling the fiber optic detector to determine whether it is ON and whether a time out of the r, z stage has occurred. Once the sensor ON test returns a NO, the motor position (or alternatively the sensor position) is calculated therefrom is stored as the coordinates of edge point 2, i.e., r2, $\theta$2. The system then enters a loop to determine whether the r, z stage is at the probe parked position, looking at the probe parked sensor, or whether the r, z stage time out has occurred. Assuming that the r, z stage reaches the probe parked position, the system then again initiates a time out counter and issues another stage rotate 120° command. The software executes exactly the same routine to determine the coordinates of the edge 3 point as the r3, $\theta$3 coordinates shown in FIG. 32. The coordinates of the center of the wafer (rc, $\theta$c) can be determined by simple trigonometric function calculations. The three edge coordinates determine two chords of a circle. The separate bisectors of those two chords, i.e., lines drawn orthogonal to the chord line at the one-half distance bisector point will intersect at the center of the circle, i.e., the center of the wafer. Once the center of the wafer coordinates rc and $\theta$c are known, the radius of the wafer can readily be calculated in a known matter as the displacement between these coordinates and the edge coordinates.

It is important to note that the first, second and third probe and sensor paths must not involve locating the edge point of the wafer at the wafer flat region since that would not give a chord of a circle and an erroneous determination of the wafer center would be produced. Once the center of the wafer has been determined and the wafer diameter has been calculated, it also possible to use the reflection sensor to determine the position of the wafer flat by moving the reflection sensor to the edge of the wafer and then issuing a sequence of r and $\theta$ commands which will effectively rotate the wafer on the platform about the wafer center so that the r, $\theta$ coordinates of the ends of the wafer flat region can be detected and registered.

From the above detailed description, the achievement of the advantageous features of this invention summarized in the introductory portion of the specification should be readily apparent. The z, $\theta$ stage of this invention provides for rapid and efficient transfer of wafers between a wafer test position and a wafer load position. Furthermore, the relative arrangement of the z, $\theta$ stage and the r, z stage makes it simple to upsize the overall system to handle larger wafer diameters.

The preferred embodiment provides a small light tight enclosure in which only the wafer platform of the z, $\theta$ stage is positioned. Only the probe head and mounting arm of the r, z stage enter this compartment. This, together with the door design, eliminates particulate sources from the vicinity of the wafer.

The system of this invention is readily adaptable to contact and non-contact type probing or testing of a semiconductor wafer. A state-of-the-art real time control of the mechanical functioning of the system is implemented along with the safety inhibit system which eliminates possible damage to system components.

The overall system is engineered for speed of execution of the wafer handling and probe handling functions. This, together with improvements in speed of the actual measurement circuitry, enables the system to process the test measurements in various testing modes as much as two or three times faster than the prior art systems. In addition, the system has the flexibility of operating under the control of a main computer or operating as a stand alone unit with limited programming for limited testing without sophisticated data collection and manipulation capabilities.

The system is packaged such that all of the electronics can fit within a single housing. The overall result is a much more user friendly system. The z, $\theta$ stage in accordance with this invention provides ease of interfacing an automated wafer loading system and the host computer can then control the overall operation of the tester as well as the wafer loader/unloader system.

It should also be apparent to person of ordinary skill in the arts of electromechanical system design and real time electronic control systems that a number of changes could be made in the specific implementation of features of the invention without departing from the principles of the invention. It would, for example, be technically feasible to provide a z, $\theta$ stage in which the entire stage, rather than an internal piston, moves in the z direction. This would not be as advantageous since it would require the mechanism to lift a substantial weight and thus the actual approach disclosed is preferred. In addition, it should be appreciated that there are a number of possible implementations of the carriage means for translating the probe head relative to the wafer platform along a radius thereof. For example, that system could involve an overhead gantry type system which carries the probe head on a set of rails which lie beside the wafer platform and above that platform in the stage down position.

It should thus be apparent that, in general, numerous changes cooul'd be made without departing from the scope of the invention as claimed in the following claims.

What is claimed is:

1. In an automatic system for testing semiconductor wafers, wafer handling stage means including a platform for carrying a semiconductor wafer, mounting means mounting said platform for rotation about a central axis and for translation of said platform orthogonal to a major surface thereof, platform drive means coupled to said mounting means to drive said platform between a wafer test position and a wafer load position, and stage drive means coupled to said mounting means for rotating said platform to accurately located angular test positions; probe handling means including carriage means for carrying a test probe parallel to the major surface of a wafer on said platform and carriage drive means for translating said carriage means between a parked position in which a test probe thereon is positioned adjacent and clear of said platform and accurately located test positions along a radius of said platform, and location sensor means associated with said carriage means for sensing when said test probe means is in said parked position; platform position sensor means associated with said wafer handling stage means for sensing when said platform is in said wafer test position; control means coupled to said platform and stage drive means for controlling the operation thereof; and inhibit means coupled between said control means and said platform and stage drive means and being coupled to said probe position and platform position sensor means for sensing the state thereof and for inhibiting operation of said platform drive means by said control means except when said probe position sensor means senses that said carriage means is in said parked position and for inhibiting operation of said state drive means by said control means except when said platform position sensor means senses that said platform is in said wafer test position.

2. In an automatic system for testing semiconductor wafers, wafer handling stage means including a platform for carrying a semiconductor wafer, mounting means mounting said platform for rotation about a central axis and for translation of said platform orthogonal to a major surface thereof, platform drive means coupled to said mounting means to drive said platform between a wafer test position and a wafer load position, and stage drive means coupled to said mounting means for rotating said platform to accurately located angular test positions; probe handling means including carriage means for carrying a test probe parallel to the major surface of a wafer on said platform and carriage drive means for translating said carriage means between a parked position in which a test probe thereon is positioned adjacent and clear of said platform and accurately located test positions along a radius of said platform, said carriage means carrying a test probe which includes at least one test probe element for contacting or approaching the surface of a semiconductor wafer; and said carriage means including a probe arm for carrying a test probe; arm mounting means for mounting said probe arm in a cantilevered manner at one end for translation orthogonal to said platform between probe up and probe down positions; probe drive means coupled to said probe arm to drive said probe arm between said probe down and probe up positions; probe position sensor means associated with said carriage means for sensing when said test probe means is in said parked position; platform position sensor means associated with said stage means for sensing when said platform is in said wafer test position; and probe status sensor means for sensing when said probe arm is in said probe up position; control means coupled to all said drive means for controlling the operation thereof; and inhibit means coupled between said control means and all of said driven means and being coupled to all said sensor means for sensing the state thereof and for inhibiting operation of said platform drive means by said control means except when said probe position sensor means senses that said carriage means is in said parked position, for inhibiting operation of said stage drive means by said control means except when said platform position sensor means senses that said platform is in said wafer test position, and for inhibiting operation of both said stage and carriage drive means except when said probe status sensor senses that said probe arm is in said probe up position.

3. The system of claim 2, wherein said stage drive means and said carriage drive means each include a drive control circuit providing an output signal on a drive busy lead that indicates when said associated drive means is busy, said inhibit means is coupled to said drive busy leads and further performs the function of inhibiting operation of said probe drive means to lower said test probe means when either of said drive busy leads indicates that said associated drive means is busy.

4. In an automatic system for testing semiconductor wafers, wafer handling stage means including a platform for carrying a semiconductor wafer, mounting means mounting said platform for rotation about a central axis and for translation of said platform orthogonal to a major surface thereof, platform drive means coupled to said mounting means to drive said platform between a wafer test position and a wafer load position, and stage drive means coupled to said mounting means for rotating said platform to accurately located angular test positions; probe handling means including carriage means for carrying a test probe parallel to the major surface of a wafer on said platform and carriage drive means for translating said carriage means between a parked position in which a test probe thereon is positioned adjacent and clear of said platform and accurately located test positions along a radius of said platform, and a light tight housing surrounding at least said platform of said stage means including an access door therein facing said wafer stage and positioned intermediate said wafer load position and said wafer test position of said platform; means mounting said access door for translation between a closed position and an open position which permits said platform to translate between said wafer load and wafer test positions; and door drive means for driving said door between said open and closed positions.

5. The system of claim 4, further comprising probe position sensor means associated with said carriage means for sensing when said test probe means is in said parked position; platform position sensor means associated with said stage means for sensing when said platform is in said wafer test position; door sensor means for sensing when said access door is in said open position; control means coupled to said platform and stage drive means and said door drive means for controlling the operation thereof; and inhibit means coupled between said control means and said platform and stage drive means and said door drive means and being coupled to said probe position and platform position sensor means and said door sensor means for sending the state thereof and for inhibiting operation of said platform drive means by said control means except when said probe position sensor means senses that said carriage means is in said parked position and said door sensor means senses that said door is in said open position and for inhibiting operation of said carriage drive means and said door drive means by said control means except when said platform position sensor means senses that said platform is in said wafer test position.

6. The system of claim 4, further comprising a protective shroud mounted within said light tight housing over said platform, said shroud having a top surface defining an opening having generally the same geometric shape as said platform and being dimensioned to have a marginal edge portion contacted by a marginal edge portion of said platform as it travels from the wafer test position toward the wafer load position so that said shroud will thereafter travel with said platform, said shroud having sidewalls extending from said top surface toward said access door to block access to regions under said platform over a major portion of the peripheral area of said platform.

7. In an automatic system for testing semiconductor wafers, wafer handling stage means including a platform for carrying a semiconductor wafer, mounting means mounting said platform for rotation about a central axis and for translation of said platform orthogonal to a major surface thereof, platform drive means coupled to said mounting means to drive said platform between a wafer test position and a wafer load position, and stage drive means coupled to said mounting means for rotating said platform to accurately located angular test positions; probe handling means including carriage means for carrying a test probe parallel to the major surface of a wafer on said platform and carriage drive means for translating said carriage means between a parked position in which a test probe thereon is positioned adjacent and clear of said platform and accurately located test positions along a radius of said platform, said mounting means comprising a hollow cylindrical housing, a hollow cylindrical rotor mounted within said housing and being carried on a pair of upper and lower bearing assemblies to provide free rotary motion of said rotor within said housing, a cylindrical piston mounted within said rotor and carrying said platform on one end thereof which extends outside said rotor, said piston being keyed to said rotor with a cooperative key and keyway arrangement for rotation of said piston with said rotor; said platform drive means comprising means communicating with said piston to drive said piston out of and into said rotor; said stage drive means comprising means communicating with said rotor to produce rotation thereof within said housing.

8. The system of claim 7, wherein said piston is a hollow piston with the interior thereof communicating with a source of vacuum; said platform includes an arrangement of interconnected grooves formed in a top face thereof and an central aperture extending through said platform to communicate with the interior of said piston to coupled vacuum to said grooves.

9. The system of claim 7, further comprising a base plate; said hollow housing being mounted on said base plate and having a fluid sealing means therebetween to prevent escape of fluid from the interior of said housing at the mounting interface; fluid sealing means extending between an outer wall of said rotor and an inner wall of said housing to prevent escape of fluid from the interior of said housing between said respective walls; said piston being mounted for translation within said rotor with a fluid tight sealing arrangement between the outer wall of said piston and the inner wall of said rotor; and means communicating fluid under pressure through said base plate to the interior of said housing to drive said piston.

10. The system of claim 9, wherein said piston is a hollow piston, a hollow tube is mounted to said base plate at one end at a position concentric with said piston and extending into the hollow interior thereof; a fluid sealing means is interposed between and interior wall of said piston and the exterior of said hollow tube to provide fluid pressure isolation between the interior of said piston and the interior of said housing; a channel being provided in said base and communicating with said hollow tubing to supply vacuum to said interior of said piston; said platform includes an arrangement of interconnected grooves formed in a top face thereof and an central aperture extending through said platform to communicate with the interior of said piston to couple said vacuum therein to said grooves.

11. The system of claim 7, further comprising a position marker carried on an exterior wall of said rotor to indicate the home position of said rotor; and an optical sensor mounted in said housing at the level of said position marker for sensing when said position marker is directly opposite said sensor to signal that said rotor is in said home position.

12. The system of claim 11, further comprising a position marker carried on an exterior surface of said piston for indicating when said piston is in a test position such that said platform is in said wafer test position; said rotor having a window through the wall thereof which is positioned opposite said position marker on said piston when said rotor is in said home position; and optical sensor means mounted in said housing opposite said window in said wall of said rotor for sensing when said piston is in said test position.

13. In an automatic system for performing sheet resistivity testing on surface layers of semiconductor wafers,
    wafer handling stage means including a platform for carrying a semiconductor wafer, mounting means for mounting said platform for rotation about a central axis and for translation of said platform orthogonal to a major surface thereof, platform drive means coupled to said mounting means to drive said platform between a wafer test position and a wafer load position, and stage drive means coupled to said mounting means for rotating said platform to accurately located angular test positions;
    probe handling means including carriage means for carrying a test probe parallel to the major surface of a wafer on said platform and carriage drive means for translating said carriage means between a parked position in which a test probe thereon is positioned adjacent and clear of said platform and accurately located test positions along a radius of said platform, said carriage means being adapted to carry a resistivity test probe which includes test probe element for contacting the surface of a semiconductor wafer and including a probe arm for carrying said test probe, arm mounting means for mounting said probe arm in a cantilevered manner at one end for translation orthogonal to said platform between probe up and probe down positions, and probe drive means coupled to said probe arm to drive said probe arm between said probe down and probe up positions;
    a light tight housing surrounding said platform including an access door therein facing said platform and positioned intermediate said wafer load position and said wafer test position of said platform, means mounting said access door for translation between a closed position and an open position which permits said platform to translate between said wafer load and wafer test positions, and door drive means for driving said door between said open and closed positions; and a sensor arrangement including probe location sensor means associated with said carriage means for sensing when said test probe is in said parked position, probe status sensor means associated with said probe arm for sensing when said test probe is in said probe up position, platform position sensor means associated with said wafer handling stage means for sensing when said platform is in said wafer test position, door position sensor means for sensing when said door is in an open position.

14. The system of claim 13, further comprising control circuit means coupled to said platform drive means, said stage drive means, said carriage driven means, said probe drive means and said door drive mans for controlling the operation of all of said drive means in response to input control signals; and inhibit circuit means coupled to said sensor arrangement and to said control circuit means for inhibiting operation of said platform drive means except when said probe position sensor means senses that said carriage means is in said parked position and said door position sensor senses that said door is in an open position, for inhibiting operation of said carriage drive means by said control means except when said platform position sensor means senses that said platform is in said wafer test position and said probe status sensor means senses that said probe arm is in a probe arm up status, for inhibiting operation of said stage drive means except when said probe arm status sensor senses that said probe arm is in a probe arm up status, and for inhibiting operation of said door drive means except when said platform position sensor senses that said platform is in said wafer test position.

15. The system of claim 14, wherein said control circuit means includes a separate drive control circuit for each of said stage drive means and said carriage drive means and each of said control circuits provides an output signal on a drive busy lead that indicates when said associated drive means is busy, said inhibit circuit is coupled to said drive busy leads and further performs the function of inhibiting operation of said probe drive means to lower said test probe means when either of said drive busy leads indicates that said associated drive means is busy.

16. The system of claim 13, wherein said mounting means comprises a hollow cylindrical housing, a hollow cylindrical rotor mounted within said housing and being carried on a pair of upper and lower bearing assemblies to provide free rotary motion of said rotor within said housing, a cylindrical piston mounted within said rotor and carrying said platform on one end thereof which extends outside said rotor, said piston being keyed to said rotor with a cooperating key and keyway arrangement for rotation of said piston with said rotor; said platform drive means comprising means communicating with said piston to drive said piston out of and into said rotor; said stage drive means comprising means communicating with said rotor to produce rotation thereof within said housing.

17. The system of claim 16, wherein said piston is a hollow piston with the interior thereof communicating with a source of vacuum; said platform includes an arrangement of interconnected grooves formed in a top face thereof and an central aperture extending through said platform to communicate with the interior of said piston to couple vacuum to said grooves.

18. The system of claim 16, further comprising a base plate; said hollow housing being mounted on said base plate and having a fluid sealing means therebetween to prevent escape of fluid from the interior of said housing at the mounting interface; fluid sealing means extending between an outer wall of said rotor and an inner wall of said housing to prevent escape of fluid from the interior of said housing between said respective walls; said piston being mounted for translation within said rotor with a fluid tight sealing arrangement between the outer wall of said piston and the inner wall of said rotor; and means communicating fluid under pressure through said base plate to the interior of said housing to drive said piston.

19. The system of claim 18, wherein said piston is a hollow piston; a hollow tube is mounted to said base plate at one end at a position concentric with said piston and extending into the hollow interior thereof; a fluid sealing means is interposed between and interior wall of said piston and the exterior of said hollow tube to provide fluid pressure isolation beteen the interior of said piston and the interior of said housing; a channel being provided in said base and communicating with said hollow tubing to supply vacuum to said interior of said piston; said platform includes an arrangement of interconnected grooves formed in a top face thereof and an central aperture extending through said platform to communicate with the interior of said piston to couple said vacuum therein to said grooves.

20. The system of claim 18, further comprising a position marker carried on an exterior wall of said rotor to indicate the home position of said rotor; and an optical sensor mounted in said housing at the level of said position marker for sensing when said position marker is directly opposite said sensor to signal that said rotor is in said home position.

21. The system of claim 20, further comprising a position marker carried on an exterior surface of said piston for indicating when said piston is in a test position such that said platform is in said wafer test position; said rotor having a window through the wall thereof which is positioned opposite said position marker on said piston when said rotor is in said home position; and optical sensor means mounted in said housing opposite said window in said wall of said rotor for sensing when said piston is in said test position.

* * * * *